(12) United States Patent
Chung et al.

(10) Patent No.: US 11,231,996 B2
(45) Date of Patent: *Jan. 25, 2022

(54) SEMICONDUCTOR MEMORY DEVICES, MEMORY SYSTEMS INCLUDING THE SAME AND METHODS OF OPERATING MEMORY SYSTEMS

(71) Applicant: SAMSUNG ELECTRONICS CO., LTD., Suwon-si (KR)

(72) Inventors: Hoi-Ju Chung, Yongin-si (KR); Sang-Uhn Cha, Yongin-si (KR); Ho-Young Song, Hwaseong-si (KR); Hyun-Joong Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/137,535

(22) Filed: Dec. 30, 2020

(65) Prior Publication Data

US 2021/0149764 A1    May 20, 2021

Related U.S. Application Data

(63) Continuation of application No. 16/894,115, filed on Jun. 5, 2020, now Pat. No. 10,929,225, which is a
(Continued)

(30) Foreign Application Priority Data

Nov. 16, 2015 (KR) .................. 10-2015-0160106

(51) Int. Cl.
*G06F 3/06* (2006.01)
*G06F 11/10* (2006.01)
(Continued)

(52) U.S. Cl.
CPC .......... *G06F 11/1068* (2013.01); *G06F 3/064* (2013.01); *G06F 3/0619* (2013.01);
(Continued)

(58) Field of Classification Search
CPC .... G06F 11/1068; G06F 3/064; G06F 3/0679; G06F 3/0619; G11C 29/52; G11C 29/70; G11C 2029/0409; G11C 2029/0411
See application file for complete search history.

(56) References Cited

U.S. PATENT DOCUMENTS 5,127,014 A    6/1992    Raynham
5,134,616 A    7/1992    Barth, Jr. et al.
(Continued)

FOREIGN PATENT DOCUMENTS

CN    101286358    10/2008
CN    101458957    6/2009
(Continued)

OTHER PUBLICATIONS

Office Action dated Aug. 6, 2020 in Corresponding U.S. Appl. No. 16/894,115.
(Continued)

*Primary Examiner* — Mohammed A Bashar
(74) *Attorney, Agent, or Firm* — F. Chau & Associates, LLC

(57) ABSTRACT

A semiconductor memory device includes a memory cell array, an error correction circuit, an error log register and a control logic circuit. The memory cell array includes a plurality of memory bank arrays and each of the memory bank arrays includes a plurality of pages. The control logic circuit is configured to control the error correction circuit to perform an ECC decoding sequentially on some of the pages designated at least one access address for detecting at least one bit error, in response to a first command received from
(Continued)

a memory controller. The control logic circuit performs an error logging operation to write page error information into the error log register and the page error information includes a number of error occurrence on each of the some pages determined from the detecting.

20 Claims, 22 Drawing Sheets

Related U.S. Application Data continuation of application No. 16/015,534, filed on Jun. 22, 2018, now Pat. No. 10,705,908, which is a continuation of application No. 15/238,216, filed on Aug. 16, 2016, now Pat. No. 10,037,244.

(51) Int. Cl.
*G11C 29/52* (2006.01)
*G11C 29/00* (2006.01)
*G11C 29/04* (2006.01)

(52) U.S. Cl.
CPC ............ *G06F 3/0679* (2013.01); *G11C 29/52* (2013.01); *G11C 29/70* (2013.01); *G11C 2029/0409* (2013.01); *G11C 2029/0411* (2013.01)

(56) References Cited

U.S. PATENT DOCUMENTS

| | | | |
|---|---|---|---|
| 6,158,025 A | 12/2000 | Brisse et al. | |
| 6,813,199 B2 | 11/2004 | Hidaka | |
| 7,447,950 B2 | 11/2008 | Takahashi et al. | |
| 7,823,045 B2 | 10/2010 | Chen et al. | |
| 8,112,680 B2 | 2/2012 | Chung et al. | |
| 8,533,564 B2 | 9/2013 | Yurzola et al. | |
| 8,671,329 B2 | 3/2014 | Kumar et al. | |
| 8,799,569 B2 | 8/2014 | Harris et al. | |
| 8,812,933 B2 | 8/2014 | Joo et al. | |
| 8,972,826 B2 | 3/2015 | Lu | |
| 9,009,566 B2 | 4/2015 | Hung et al. | |
| 9,083,382 B2 | 7/2015 | Nemazie | |
| 9,229,805 B2 | 1/2016 | Yim et al. | |
| 9,417,959 B2 | 8/2016 | Hsiao | |
| 10,037,244 B2 | 7/2018 | Chung et al. | |
| 2008/0133994 A1 | 6/2008 | Oh | |
| 2009/0307537 A1 | 12/2009 | Chen et al. | |
| 2011/0191649 A1 | 8/2011 | Lim et al. | |
| 2011/0225475 A1 | 9/2011 | Kumar et al. | |
| 2012/0173826 A1 | 7/2012 | Takaku | |
| 2012/0317352 A1 | 12/2012 | Kang et al. | |
| 2014/0040560 A1 | 2/2014 | Kegel et al. | |
| 2014/0063955 A1* | 3/2014 | Kawase | G11C 16/26 365/185.12 |
| 2014/0245105 A1 | 8/2014 | Chung et al. | |
| 2015/0074491 A1 | 3/2015 | Hoya | |
| 2015/0199234 A1 | 7/2015 | Choi et al. | |
| 2015/0212886 A1 | 7/2015 | Coteus et al. | |
| 2015/0254136 A1 | 9/2015 | Hoya et al. | |
| 2016/0055052 A1* | 2/2016 | Hu | G06F 11/1048 714/799 |
| 2017/0139771 A1 | 5/2017 | Chung et al. | |
| 2018/0322008 A1 | 11/2018 | Chung et al. | |
| 2020/0301779 A1 | 9/2020 | Chung et al. | |

FOREIGN PATENT DOCUMENTS

| | | |
|---|---|---|
| CN | 102693760 | 9/2012 |
| CN | 103093818 | 5/2013 |
| CN | 103197984 | 7/2013 |
| CN | 103377090 | 10/2013 |
| CN | 103678027 | 3/2014 |
| CN | 104299637 | 1/2015 |
| CN | 104657231 | 5/2015 |
| CN | 104871249 | 8/2015 |
| KR | 10-2015-0084244 | 7/2015 |

OTHER PUBLICATIONS

CN Office Action dated Oct. 11, 2021 In Corresponding Application No. CN 201610991835.7.
Office Action dated Nov. 26, 2021 from the Korean Intellectual Property Office (KIPO) in the corresponding Korean Patent Application No. 10-2015-0160106.

* cited by examiner

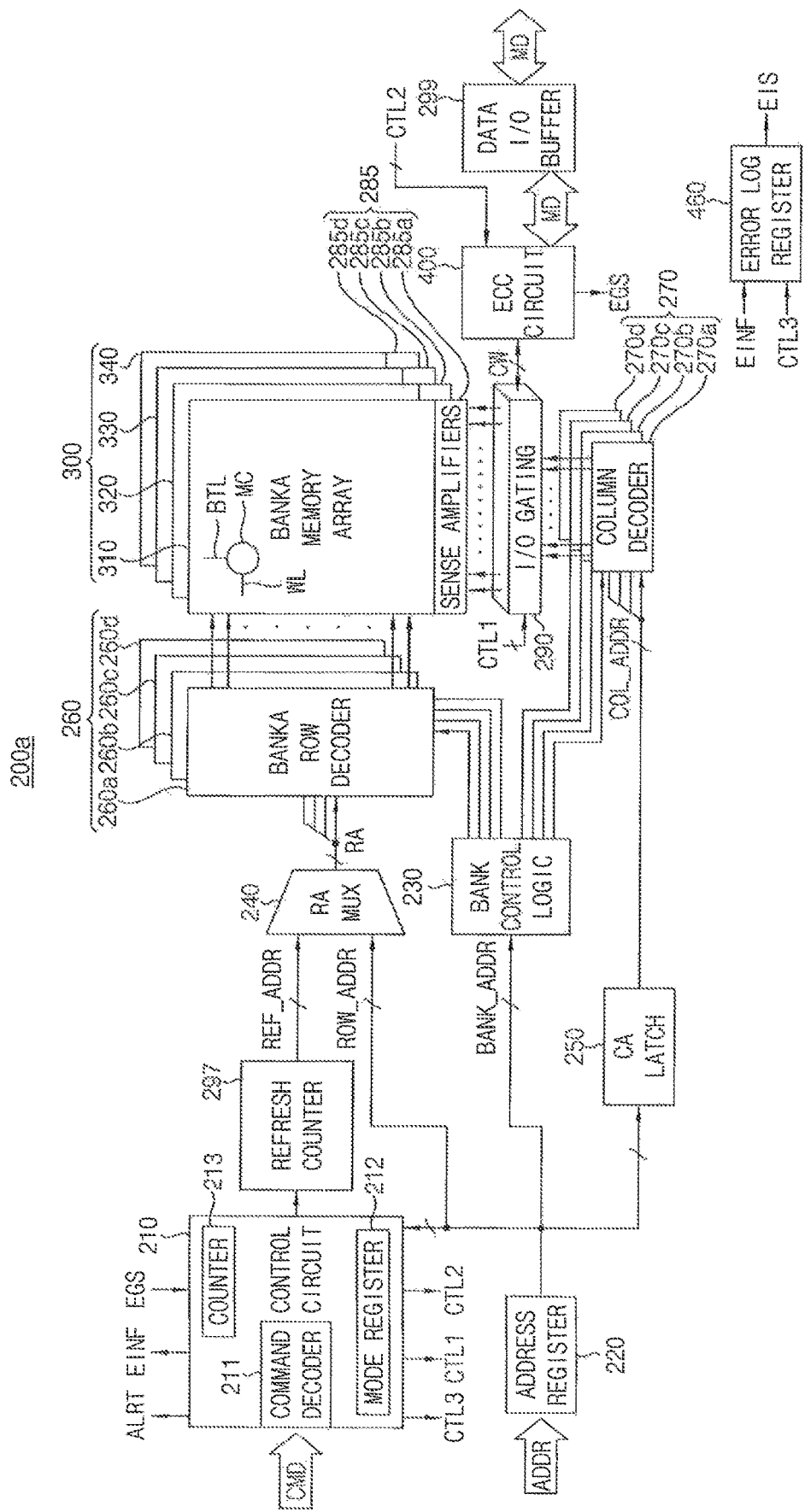

| | RNK | ADDINF (BGA,BA,RA) | ECNT | FCWCNT | FG | DINF |
|---|---|---|---|---|---|---|
| Idx1 | 2 | A | 2 | 2 | 0 | 0 |
| Idx2 | 1 | B | 4 | 3 | 0 | 1 |
| ⋮ | ⋮ | ⋮ | ⋮ | ⋮ | ⋮ | ⋮ |
| Idxp | 3 | X | 1 | 1 | 1 | 0 |

461  462  463  464  465  466

SEMICONDUCTOR MEMORY DEVICES, MEMORY SYSTEMS INCLUDING THE SAME AND METHODS OF OPERATING MEMORY SYSTEMS

CROSS-REFERENCE TO RELATED APPLICATIONS

This U.S. application is a continuation application of U.S. patent application Ser. No. 16/894,115 filed Jun. 5, 2020, which is a continuation application of U.S. patent application Ser. No. 16/015,534 filed Jun. 22, 2018, issued as U.S. Pat. No. 10,705,908 on Jul. 7, 2020, which is a continuation application of U.S. patent application Ser. No. 15/238,216 filed Aug. 16, 2016, issued as U.S. Pat. No. 10,037,244 on Jul. 31, 2018, which claims priority under 35 USC § 119 to Korean Patent Application No. 10-2015-0160106, filed on Nov. 16, 2015, in the Korean Intellectual Property Office, the disclosures of which are incorporated by reference in their entirety herein.

BACKGROUND

1. Technical Field

The present disclosure relates to memories, and more particularly to semiconductor memory devices, memory systems including the same and methods of operating memory systems.

2. Discussion of Related Art

Semiconductor memory devices may be classified into non-volatile memory devices such as flash memory devices and volatile memory devices such as Dynamic Random Access Memories (DRAMs). High speed operation and cost efficiency of DRAMs make it possible for DRAMs to be used for computer system memories.

Electrical or magnetic interference inside a computer system can cause a single bit of a DRAM to spontaneously flip to the opposite state, resulting in a bit error. Further, when a specific address is intensively applied to the DRAM, data retention reliability of memory cells coupled to a word-line designated by the specific address may degrade.

SUMMARY

According to an exemplary embodiment of the inventive concept, a semiconductor memory device includes a memory cell array, an error correction circuit, an error log register and a control logic circuit. The memory cell array includes a plurality of memory bank arrays and each of the memory bank arrays includes a plurality of pages. The control logic circuit is configured to control the error correction circuit to perform an error check and correction (ECC) decoding sequentially on some pages designated at least one access address for detecting at least one bit error, in response to a first command from a memory controller. The control logic circuit performs an error logging operation to write page error information into the error log register and the page error information includes a number of error occurrences on each of the some pages determined from the detecting.

According to an exemplary embodiment of the inventive concept, a memory system includes the semiconductor memory device and the memory controller. The memory controller controls the at least one semiconductor memory device.

According to an exemplary embodiment of the inventive concept, a method of operating a memory system including a semiconductor memory device and a memory controller that controls the semiconductor memory device is provided. The method includes the memory controller generating a command and an access address, the semiconductor memory device performing an error check and correction (ECC) decoding on some pages of the memory device designated by the access address for detecting at least one bit error, in response to the command, and the semiconductor memory device performing an error logging operation to write page error information into the error log register, the page error information including a number of error occurrences on each of the some pages determined from the detecting.

According to an exemplary embodiment of the inventive concept, a semiconductor memory device includes a memory cell array, a register, and a controller. The register stores storing error occurrence counts for each page of a plurality of pages of the memory cell array. The controller is configured to receive a command through a first pin of the semiconductor memory device, receive an address through a second pin of the semiconductor memory device, receive data through a third pin of the semiconductor memory device during a first mode, and output a signal including information of the register through the third pin to a memory controller during a second other mode.

BRIEF DESCRIPTION OF THE DRAWINGS

Exemplary embodiments of the inventive concept will be described below in more detail with reference to the accompanying drawings.

FIG. 3 is a block diagram illustrating the semiconductor memory device shown in FIG. 2, according to an exemplary embodiment of the inventive concept.

DETAILED DESCRIPTION

The inventive concept will be described more fully hereinafter with reference to the accompanying drawings, in which exemplary embodiments thereof are shown. However, the present inventive concept may be embodied in many different forms and should not be construed as limited to the exemplary embodiments set forth herein. It should also be emphasized that the present inventive concept provides details of alternative examples, but such listing of alternatives is not exhaustive. Like numerals refer to like elements throughout.

It will be understood that when an element is referred to as being "connected" or "coupled" to another element, it can be directly connected or coupled to the other element or intervening elements may be present. As used herein, the singular forms "a," "an" and "the" are intended to include the plural forms as well, unless the context clearly indicates otherwise.

Figure 1:
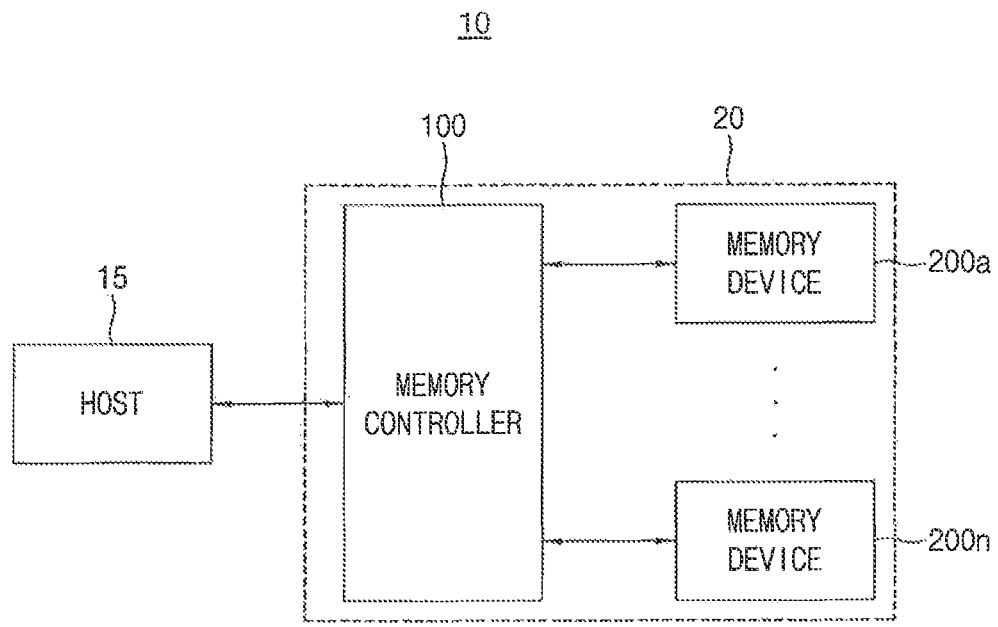
FIG. 1 is a block diagram illustrating an electronic system according to an exemplary embodiment of the inventive concept.

FIG. 1 is a block diagram illustrating an electronic system according to an exemplary embodiment of the inventive concept.

Referring to FIG. 1, an electronic system (or, an electronic device) 10 includes a host 15 (e.g., a host device, a host computer, etc.) and a memory system 20. The memory system 20 includes a memory controller 100 and a plurality of semiconductor memory devices 200a~200n (n is an integer greater than two). While FIG. 1 shows multiple semiconductor memory devices, there may only be a single semiconductor memory device in an alternate embodiment.

The host 15 may communicate with the memory system 20 through various interface protocols such as Peripheral Component Interconnect-Express (PCI-E), Advanced Technology Attachment (ATA), Serial ATA (SATA), Parallel ATA (PATA), or serial attached SCSI (SAS). In addition, the host 15 may also communicate with the memory system 20 through interface protocols such as Universal Serial Bus (USB), Multi-Media Card (MMC), Enhanced Small Disk Interface (ESDI), or Integrated Drive Electronics (IDE).

The memory controller 100 may control overall operation of the memory system 20. The memory controller 100 may control overall data exchange between the host 15 and the plurality of semiconductor memory devices 200a~200n. For example, the memory controller 100 may write data into the plurality of semiconductor memory devices 200a~200n or read data from the plurality of semiconductor memory devices 200a~200n in response to a request (e.g., a request message, a command, etc.) from the host 15. For example, the request may be a read request including a read command and an access address or a write request including a write command, an access address, and data to write. The read command and the write command may be referred to as access commands.

In addition, the memory controller 100 may apply operation commands to the plurality of semiconductor memory devices 200a~200n for controlling the plurality of semiconductor memory devices 200a~200n.

In an embodiment, each of the plurality of semiconductor memory devices 200a~200n is a memory device including resistive type memory cells such as a magnetoresistive random access memory (MRAM), a resistive random access memory (RRAM), a phase change random access memory (PRAM) and a ferroelectric random access memory (FRAM), etc. In an exemplary embodiment, each of the plurality of semiconductor memory devices 200a~200n includes dynamic memory cells such as a dynamic random access memory (DRAM).

An MRAM is a nonvolatile computer memory based on magnetoresistance. An MRAM is different from a volatile RAM in many aspects. For example, since an MRAM is nonvolatile, the MRAM may retain all stored data even when power is turned off.

Although a nonvolatile RAM is generally slower than a volatile RAM, an MRAM has read and write response times comparable with read and write response times of a volatile RAM. Unlike a volatile RAM that stores data as an electric charge, an MRAM stores data by using magnetoresistance (or magnetoresistive) elements. In general, a magnetoresistance element is made of two magnetic layers, each having a magnetization.

An MRAM is a nonvolatile memory device that reads and writes data by using a magnetic tunnel junction pattern including two magnetic layers and an insulating film disposed between the two magnetic layers. A resistance value of the magnetic tunnel junction pattern may vary according to a magnetization direction of each of the magnetic layers. The MRAM may program or remove data by using the variation of the resistance value.

An MRAM using a spin transfer torque (STT) phenomenon uses a method in which when a spin-polarized current flows in one direction, a magnetization direction of the magnetic layer is changed due to the spin transfer of electrons. A magnetization direction of one magnetic layer (e.g., a pinned layer) may be fixed and a magnetization direction of the other magnetic layer (e.g., a free layer) may vary according to a magnetic field generated by a program current.

The magnetic field of the program current may arrange the magnetization directions of the two magnetic layers in parallel or in anti-parallel. In at least one exemplary embodiment, if the magnetization directions of the two magnetic layers are parallel, a resistance between the two magnetic layers is in a low ("0") state. If the magnetization directions of the two magnetic layers are anti-parallel, a resistance between the two magnetic layers is in a high ("1") state. Switching of the magnetization direction of the free layer and the high or low state of the resistance between the two magnetic layers result in write and read operations of the MRAM.

Although the MRAM is nonvolatile and provides a quick response time, an MRAM cell has a limited scale and is sensitive to a write disturbance because the program current applied to switch the high and low states of the resistance between the magnetic layers of the MRAM is typically high. Accordingly, when a plurality of cells are arranged in an MRAM array, a program current applied to one memory cell can inadvertently change a magnetic field of a free layer of an adjacent cell. Such a write disturbance may be mitigated (or alternatively, prevented) by using an STT phenomenon. A typical STT-MRAM may include a magnetic tunnel junction (MTJ), which is a magnetoresistive data storage device including two magnetic layers (e.g., a pinned layer and a free layer) and an insulating layer disposed between the two magnetic layers.

A program current typically flows through the MTJ. The pinned layer spin-polarizes electrons of the program current, and a torque is generated as the spin-polarized electron current passes through the MTJ. The spin-polarized electron current applies the torque to the free layer while interacting with the free layer. When the torque of the spin-polarized electron current passing through the MTJ is greater than a threshold switching current density, the torque applied by the spin-polarized electron current is sufficient to switch a magnetization direction of the free layer. Accordingly, the magnetization direction of the free layer may be parallel or anti-parallel to the pinned layer and a resistance state in the MTJ is changed.

The STT-MRAM removes a requirement of an external magnetic field for the spin-polarized electron current to switch the free layer in the magnetoresistive device. In addition, the STT-MRAM improves scaling as a cell size is reduced and the program current is reduced to mitigate (or alternatively, prevent) the write disturbance. In addition, the STT-MRAM may have a high tunnel magnetoresistance ratio, which improves a read operation in a magnetic domain by allowing a high ratio between the high and low states.

An MRAM is low cost and has high capacity (like a dynamic random access memory (DRAM), operates at high speed (like a static random access memory (SRAM), and is nonvolatile (like a flash memory).

Figure 2:
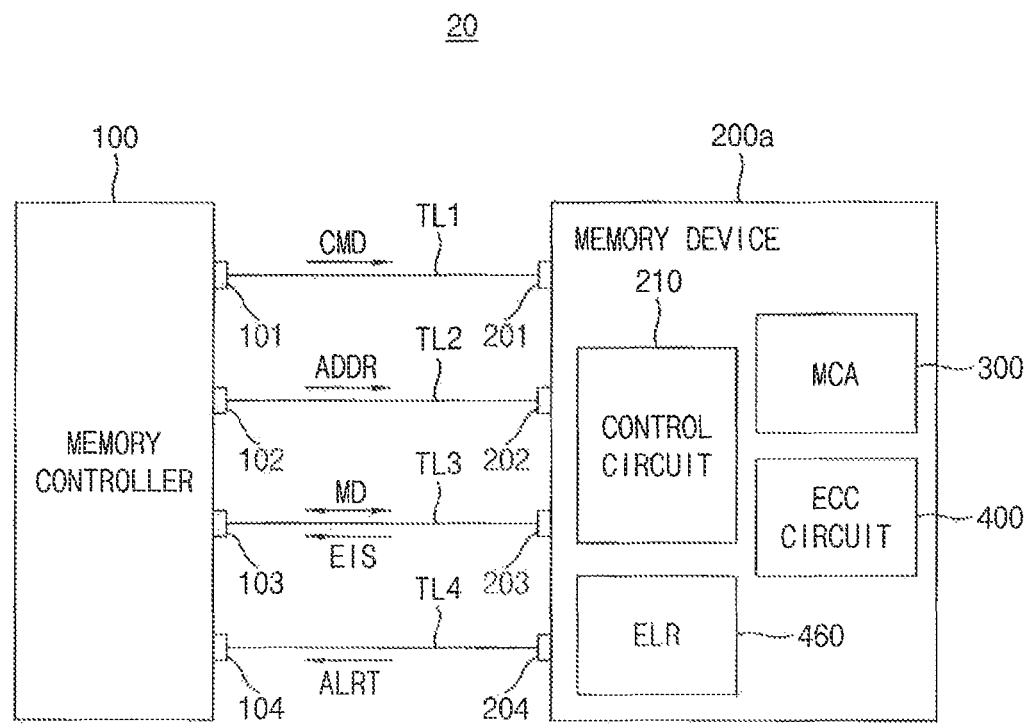
FIG. 2 is a block diagram illustrating the memory system shown in FIG. 1 according to an exemplary embodiment of the inventive concept.

FIG. 2 is a block diagram illustrating the memory system shown in FIG. 1 according to an exemplary embodiment of the inventive concept.

In FIG. 2, only one semiconductor memory device 200a in communication with the memory controller 100 is illustrated for convenience. However, the details discussed herein related to a semiconductor memory device 200a may equally apply to the other semiconductor memory devices 200b~200n.

Referring to FIG. 2, the memory system 20 includes the memory controller 100 and the semiconductor memory device 200a. Each of the memory controller 100 and the semiconductor memory device 200a may be formed as a separate semiconductor chip or as a separate group of chips (e.g., the memory controller 100 and the semiconductor memory device 200a may be packaged together in stack of the semiconductor chips).

The memory controller 100 and the semiconductor memory device 200a are connected to each other through corresponding command pins 101 and 201, corresponding address pins 102 and 202, corresponding data pins 103 and 203 and corresponding separate pins 104 and 204. The command pins 101 and 201 transmit a command signal CMD through a command transmission line TL1, the address pins 102 and 202 transmit an address signal ADDR through an address transmission line TL2, and the data pins 103 and 203 exchange main data MD in a normal mode and transmit an error information signal EIS in an error check and scrub (ECS) mode through a data transmission line TL3. The separate pins 104 and 204 transmit an alert signal ALRT to the memory controller 100 in the ECS mode.

The semiconductor memory device 200a includes a memory cell array 300 that stores the main data MD, an error correction circuit 400, an error log register 460 and a control logic circuit 210 (also referred to as a 'control logic') that controls the error correction circuit 400. In an embodiment, a main controller includes the control circuit 210 and the error correction circuit 400.

When the command CMD designates the ECS mode, the control logic circuit 210 may control the error correction circuit 400 to perform an error check and correction (ECC) decoding sequentially on each read data from some pages designated by address signal ADDR to generate an error generation signal. The control logic circuit 210 may perform an error logging operation to write page error information in each row of the error log register 460 and the page error information may include at least a number of error occurrences on each of the some pages. When the CMD is a register read command RRD, the control logic circuit 210 may provide the memory controller 100 with all or part of the page error information in the error log register 460 as the error information signal EIS.

FIG. 3 is a block diagram illustrating the semiconductor memory device shown in FIG. 2, according to an exemplary embodiment of the inventive concept.

Referring to FIG. 3, the semiconductor memory device 200a includes the control logic circuit 210, an address register 220, a bank control logic 230, a refresh counter 297, a row address multiplexer 240, ('RA MUX') a column address latch 250 ('CA LATCH'), a row decoder 260, a column decoder 270, the memory cell array 300, a sense amplifier unit 285, an input/output (I/O) gating circuit 290, the error correction circuit 400, a data input/output (I/O) buffer 299, and an error log register 460. The column address latch 250 may include one or more latch circuits. The sense amplifier unit 285 may include one or more sense amplifiers.

In an embodiment, the refresh counter 297 is omitted from the semiconductor memory device 200a. That is, when the memory cell array 300 is implemented with a plurality of resistive type memory cells, the refresh counter 297 is omitted from the semiconductor memory device 200a.

The memory cell array 300 includes first through fourth bank arrays 310~340. The row decoder 260 includes first through fourth bank row decoders 260a~260d respectively coupled to the first through fourth bank arrays 310~340. The column decoder 270 includes first through fourth bank column decoders 270a~270d respectively coupled to the first through fourth bank arrays 310~340. The sense amplifier unit 285 includes first through fourth bank sense amplifiers 285a~280d respectively coupled to the first through fourth bank arrays 310~340. Each of the first through fourth bank arrays 310~340 may include a plurality of memory cells MC, and each of memory cells MC is coupled to a corresponding word-line WL and a corresponding bit-line BTL. The first through fourth bank arrays 310~340, the first through fourth bank row decoders 260a~260d, the first through fourth bank column decoders 270a~270d and first through fourth bank sense amplifiers 285a~280d may form first through fourth banks. Although the semiconductor memory device 200a shown in FIG. 3 illustrates four banks, the semiconductor memory device 200a may have less than four banks or greater than four banks in other embodiments.

The address register 220 receives an address ADDR including a bank address BANK_ADDR, a row address ROW_ADDR and a column address COL_ADDR from the memory controller 100. The address register 220 provides the received bank address BANK_ADDR to the bank control logic 230, provides the received row address ROW_ADDR to the row address multiplexer 240, and provides the received column address COL_ADDR to the column address latch 250. The address ADDR may be provided by the memory controller 100 along with a command (e.g., a write or read) so that the command is applied to an area of the memory cell array 300 with a location corresponding to the address ADDR.

The bank control logic 230 may generate bank control signals in response to the bank address BANK_ADDR. One of the first through fourth bank row decoders 260a~260d corresponding to the bank address BANK_ADDR may be activated in response to the bank control signals, and one of the first through fourth bank column decoders 270a~270d corresponding to the bank address BANK_ADDR may be activated in response to the bank control signals.

The refresh counter 297 generates a refresh row address REF_ADDR for refreshing memory cell rows in the memory cell array 300 under control of the control logic circuit 210. The refresh counter 297 may be included when the memory cells MC are implemented with dynamic memory cells.

The row address multiplexer 240 receives the row address ROW_ADDR from the address register 220, and receives the refresh row address REF_ADDR from the refresh counter 297. The row address multiplexer 240 selectively outputs the row address ROW_ADDR or the refresh row address REF_ADDR as a row address RA. The row address RA that is output from the row address multiplexer 240 is applied to the first through fourth bank row decoders 260a~260d.

The activated one of the first through fourth bank row decoders 260a~260d decode the row address RA that is output from the row address multiplexer 240, and activates a word-line corresponding to the row address RA. For example, the activated bank row decoder may apply a word-line driving voltage to the word-line corresponding to the row address RA.

The column address latch 250 receives the column address COL_ADDR from the address register 220, and temporarily stores the received column address COL_ADDR. In an embodiment, in a burst mode, the column address latch 250 generates column addresses that increment from the received column address COL_ADDR. The column address latch 250 may apply the temporarily stored or generated column addresses to the first through fourth bank column decoders 270a~270d.

The activated one of the first through fourth bank column decoders 270a~270d decodes the column address COL_ADDR that is output from the column address latch 250, and controls the I/O gating circuit 290 to output data corresponding to the column address COL_ADDR.

The I/O gating circuit 290 includes a circuitry for gating input/output data. The I/O gating circuit 290 may further include input data mask logic, read data latches for storing data that is output from the first through fourth bank arrays 310~340, and write drivers for writing data to the first through fourth bank arrays 310~340.

Data read from one bank array of the first through fourth bank arrays 310~340 may be sensed by sense amplifiers coupled to the one bank array from which the data is to be read, and may be stored in the read data latches. Main data MD to be written into one bank array of the first through fourth bank arrays 310~340 may be provided to the data I/O buffer 299 from the memory controller 100. The main data MD provided to the data I/O buffer 299 is provided to the error correction circuit 400. The main data MD is encoded in the error correction circuit 400 to generate a codeword CW, and the codeword CW is provided to the I/O gating circuit 290. The write driver may write the codeword CW in one bank array of the first through fourth bank arrays 310~340.

The data I/O buffer 299 may provide the main data MD from the memory controller 100 to the error correction circuit 400 in a write operation and may provide the main data MD from the error correction circuit 400 to the memory controller 100 in a read operation. The data I/O buffer 299 may receive the data mask signal DM from the memory controller 100 and may provide the data mask signal DM to the I/O gating circuit 290.

The error correction circuit 400, in a write operation, may generate parity data based on the main data MD from the data I/O buffer 299, and may provide the I/O gating circuit 290 with the codeword CW including the main data MD and the parity data. The I/O gating circuit 290 may write the codeword CW in one bank array.

In addition, the error correction circuit 400, in a read operation, may receive the codeword CW, read from one bank array, from the I/O gating circuit 290. In an embodiment, the error correction circuit 400 performs an ECC decoding on the main data MD based on the parity data in the codeword CW, corrects a single bit error in the main data MD to generate corrected main data and provides the corrected main data to the data I/O buffer 299.

In addition, the error correction circuit 400 may perform a scrubbing operation by reading a first unit of data from each of a plurality sub-pages constituting each page of some pages of the memory cell array 300 and perform an ECC decoding on each first unit of data sequentially in the ECS mode. The first unit of data includes main data and parity data. The error correction circuit 400 may provide an error generation signal EGS to the control logic circuit 210 when the first unit of data includes at least one bit error based on a result of the ECC decoding.

When the first unit of data includes at least one bit error, the control logic circuit 210 may control the error correction circuit 400 to perform a scrubbing operation by correcting the at least one bit error to generate corrected first unit of data and writing back the corrected first unit of data to a memory location corresponding to the sub-page. The control logic circuit 210 may count a number of the error generation signal EGS and may perform an error logging operation.

The control logic circuit 210 may control operations of the semiconductor memory device 200a. For example, the control logic circuit 210 may generate control signals for the semiconductor memory device 200a to perform a write operation or a read operation. The control logic circuit 210 includes a command decoder 211 that decodes a command CMD received from the memory controller 100 and a mode register 212 that sets an operation mode of the semiconductor memory device 200a. The control logic circuit 210 further includes a counter 213 that counts the error generation signal EGS.

For example, the command decoder 211 may generate the control signals corresponding to the command CMD by decoding a write enable signal (/WE), a row address strobe signal (/RAS), a column address strobe signal (/CAS), a chip select signal (/CS), etc. The control logic circuit 210 may generate a first control signal CTL1 to control the I/O gating circuit 290, a second control signal CTL2 to control the error correction circuit 400 and a third control signal CTL3 to control the error log register 460.

When the command CMD designates the ECS mode, the control logic circuit 210 generates the first through third control signals CTL1, CTL2 and CTL3 such that the I/O gating circuit 290 and the error correction circuit 400 perform the scrubbing operation and the error logging operation.

In an embodiment of the inventive concept, the control logic circuit 210 notifies the memory controller 100 of a first situation immediately by using an alert signal ALRT, when the number of error occurrences (e.g., bit errors) in one page reaches a threshold. The memory controller 100 applies a scrubbing command to the semiconductor memory device 200a in response to the alert signal ALRT, and the control logic circuit 210 controls the I/O gating circuit 290 and the error correction circuit 400 to perform the scrubbing operation on the one page. In an embodiment, the control logic circuit 210 notifies the memory controller 100 of the first situation by maintaining the alert signal ALRT at a logic high level during a first interval. For example, when the first situation is not occurring, the control logic circuit 210 maintains the alert signal ALRT at a logic low level.

When the command CMD is the scrubbing command, the command CMD constitutes signals different from signals for a read command designating a read operation or a write command designating a write operation of the semiconductor memory device 200a. For example, the scrubbing command, the read command, and the write command have different formats so that the command decoder 211 can distinguish them from one another, and operate accordingly.

FIGS. 4A to 4E are circuit diagrams of examples of the memory cell shown in FIG. 3, according to exemplary embodiments of the inventive concept.

Figure 4A:
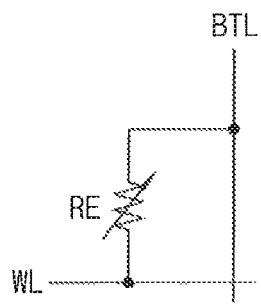
FIGS. 4A to 4E are circuit diagrams of examples of the memory cell shown in FIG. 3, according to exemplary embodiments of the inventive concept.
Figure 4B:
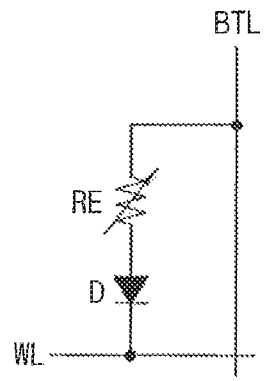
Figure 4C:
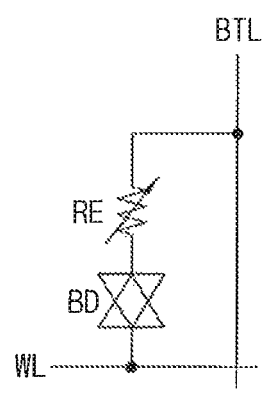
Figure 4D:
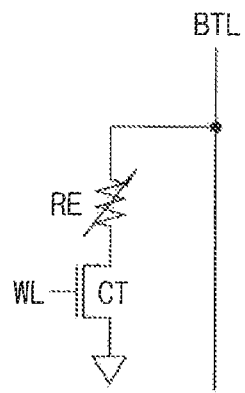
Figure 4E:
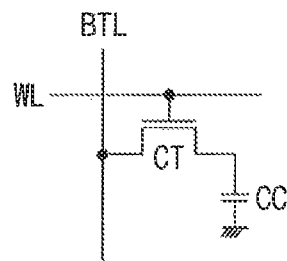

FIGS. 4A to 4D illustrate memory cells MC which are implemented with resistive type memory cells and FIG. 4E illustrates a memory cell MC which is implemented with a dynamic memory cell.

FIG. 4A illustrates a resistive type memory cell without a selection element, while FIGS. 4B to 4D show resistive type memory cells each comprising a selection element.

Referring to FIG. 4A, a memory cell MC includes a resistive element RE connected to a bit-line BTL and a word-line WL. Such a resistive memory cell having a structure without a selection element may store data when a voltage is applied across the bit-line BL and the word-line WL.

Referring to FIG. 4B, a memory cell MC includes a resistive element RE and a diode D. The resistive element RE may include a resistive material for data storage. The diode D may be a selection element (or switching element) that supplies current to the resistive element RE or cuts off the current supply to resistive element RE according to a bias of a word-line WL and a bit-line BTL. The diode D is coupled between the resistive element RE and word-line WL, and the resistive element RE is coupled between the bit-line BTL and the diode D. Positions of the diode D and the resistive element RE may be interchanged. For example, the diode D may be connected between the resistive element RE and the bit line BTL. The diode D may be turned on or turned off by application of a word-line voltage to the word-line WL. Thus, a resistive memory cell may be not driven when a voltage of a constant level or higher is supplied to an unselected word-line WL.

Referring to FIG. 4C, a memory cell MC includes a resistive element RE and a bidirectional diode BD. The resistive element R may include a resistive material for data storage. The bidirectional diode BD is coupled between the resistive element RE and a word-line WL, and the resistive element RE is coupled between a bit-line BTL and bidirectional diode BD. Positions of the bidirectional diode BD and the resistive element RE may be interchanged. For example, the bidirectional diode BD may be connected between the resistive element R and the bit-line BTL. The bidirectional diode BD may block leakage current flowing to an unselected semiconductor memory cell.

Referring to FIG. 4D, a memory cell MC includes a resistive element RE and a transistor CT. The transistor CT may be a selection element (or switching element) that supplies current to the resistive element RE or cuts off the current supply to the resistive element RE according to a voltage applied to a word-line WL. The transistor CT is coupled between the resistive element RE and a word-line WL, and the resistive element RE is coupled between a bit-line BTL and the transistor CT. Positions of the transistor CT and the resistive element RE may be interchanged. For example, the transistor CT may be connected between the resistive element RE and the bit line BTL. The semiconductor memory cell may be selected or unselected depending on whether the transistor CT driven by word-line WL is turned on or turned off. For example, the word-line WL is connected to a gate of the transistor CT so that a word-line voltage can be applied to turn on or turn off the transistor CT. The transistor CT may be connected between a ground voltage and the resistive element RE.

Referring to FIG. 4E, a memory cell MC includes a cell capacitor CC and a transistor CT. The transistor CT may be a selection element (or switching element) that connects/disconnects a cell capacitor CC to/from bit-line BTL according to a voltage of a word-line WL. The transistor CT is coupled between the cell capacitor CC, a word-line WL and a bit-line BTL, and the cell capacitor CC is coupled between the transistor CT and a plate voltage (not illustrated).

Figure 5:
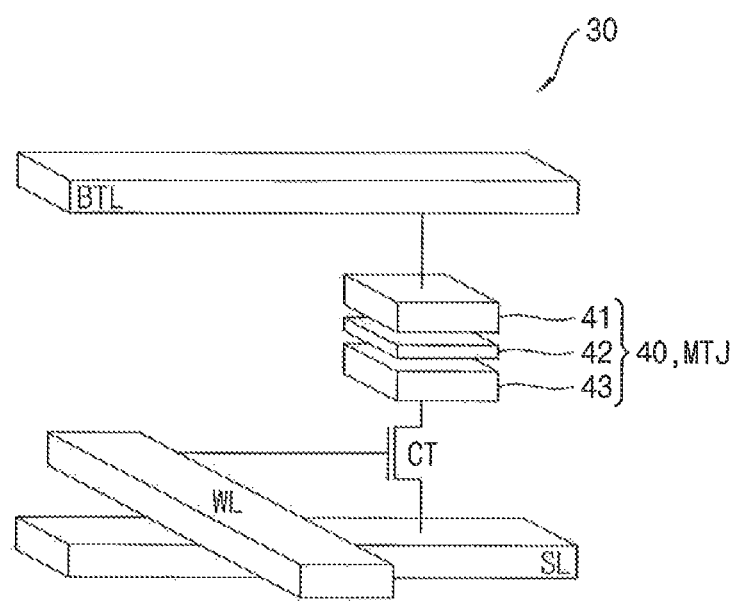
FIG. 5 illustrates an example of the memory cell (referred to as STT-MRAM cell) in FIG. 3 according to an exemplary embodiment of the inventive concept.

FIG. 5 illustrates an example of the memory cell (referred to as STT-MRAM cell) shown in FIG. 3 according to an exemplary embodiment of the inventive concept.

Referring to FIG. 5, an STT-MRAM cell 30 includes a MTJ element 40 and a cell transistor CT. A gate of the cell transistor CT is connected to a word-line WL and one electrode of the cell transistor CT is connected through the MTJ 40 to a bit-line BTL. Also, the other electrode of the cell transistor CT is connected to a source line SL.

The MTJ element 40 includes the free layer 41, the pinned layer 43, and a tunnel layer 42 disposed between the free layer 41 and the pinned layer 43. A magnetization direction of the pinned layer 43 may be fixed, and a magnetization direction of the free layer 41 may be parallel to or antiparallel to the magnetization direction of the pinned layer 43 according to written data. For example, an anti-ferromagnetic layer (not shown) may be further provided to fix the magnetization direction of the pinned layer 43.

A write operation of the STT-MRAM cell 30 may be performed by applying a logic high voltage to the word-line WL to turn on the cell transistor CT. A program current, for example, a write current is applied to the bit-line BTL and the source line SL. A direction of the write current is determined by a logic state of the MTJ element 40.

A read operation of the STT-MRAM cell 30 may be performed by applying a logic high voltage to the word-line WL to turn on the cell transistor CT, and a read current is supplied to the bit-line BTL and the source line SL. Accordingly, a voltage developed at both ends of the MTJ element 40 is detected by the sense amplifier 285a, and is compared with a reference voltage to determine a logic state of the MTJ element 40. Accordingly, data stored in the MTJ element 40 may be detected.

Figure 6A:
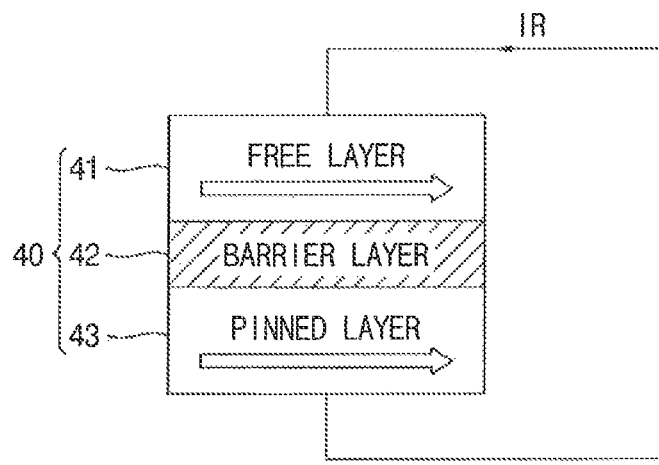
FIGS. 6A and 6B illustrate a magnetization direction according to data written to the MTJ element shown in FIG. 5.
Figure 6B:
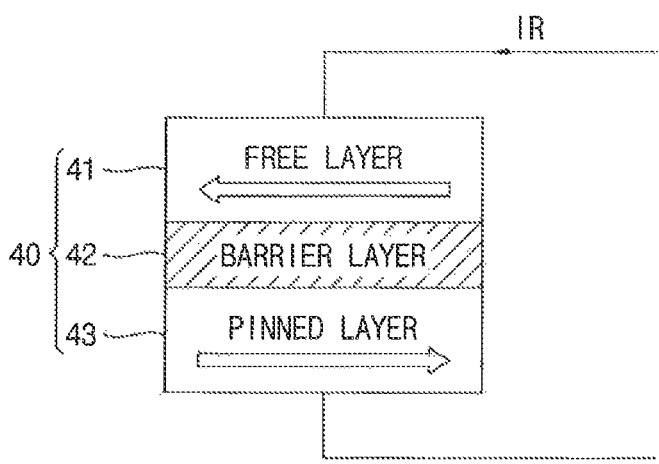

FIGS. 6A and 6B illustrate a magnetization direction according to data written to the MTJ element shown in FIG. 5.

A resistance value of the MTJ element 40 may vary according to a magnetization direction of the free layer 41. When a read current IR flows through the MTJ 40, a data voltage is output according to the resistance value of the MTJ element 40. Since the read current IR is much smaller than a write current, a magnetization direction of the free layer 41 is not changed by the read current IR.

Referring to FIG. 6A, a magnetization direction of the free layer 41 and a magnetization direction of the pinned layer 43 of the MTJ element 40 are parallel. Accordingly, the MTJ element 40 may have a low resistance value. In this case, the MTJ element 40 may read data '0'.

Referring to FIG. 6B, a magnetization direction of the free layer 41 and a magnetization direction of the pinned layer 43 of the MTJ element 40 are anti-parallel. Accordingly, the MTJ element 40 may have a high resistance value. In this case, the MTJ element 40 may read data '1'.

Although the free layer 41 and the pinned layer 43 of the MTJ element 40 are horizontal magnetic layers, example embodiments are not limited thereto and the free layer 41 and the pinned layer 43 may be, for example, vertical magnetic layers.

Figure 7:
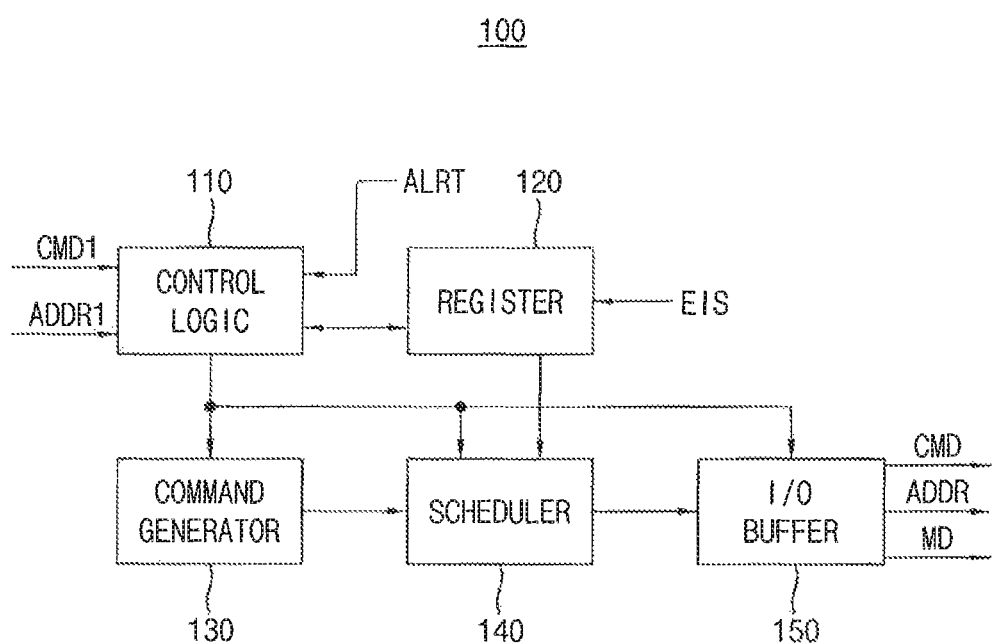
FIG. 7 is a block diagram illustrating the memory controller in FIG. 2 according to an exemplary embodiment of the inventive concept.

FIG. 7 is a block diagram illustrating the memory controller in FIG. 2 according to an exemplary embodiment of the inventive concept.

Referring to FIG. 7, the memory controller 100 includes a control logic 110 (e.g., a control circuit), a register 120, a command generator 130 (e.g., a circuit), a scheduler 140 (e.g., a scheduling circuit) and an input/output (I/O) buffer 150.

The command generator 130 generates a command signal and provides the command signal to the scheduler 120 under control of the control logic 110 such that the memory device 200a performs active, read and write operations. In an embodiment, an active operation is applied to a word-line for enabling the word line to select a memory cell.

The register 120 stores an error information signal EIS received from the semiconductor memory device 200a.

The control logic 110 controls the command generator 130 to generate the command signal based on a command signal CMD1 and an address signal ADDR1 from the host 15 such that the semiconductor memory device 200a performs active, read and write operations. In addition, the control logic 110 controls the command generator 130, the scheduler 140 and the I/O buffer 150 so that a scrubbing command is immediately provided to the semiconductor memory device 200a in response to the alert signal ALRT. The control logic 110 may determine an error management policy for the semiconductor memory device 200a by referring to the error information signal EIS stored in the register 120.

The I/O buffer 150 may temporarily store signals which are to be transmitted to the semiconductor memory device 200a or which are transmitted from the semiconductor memory device 200a. The semiconductor memory device 200a is connected to the I/O buffer 150 through the command pin 101, the address pin 102, the data pin 103 and the dedicated pin 104. The memory controller 100 may transmit data, address signals and operating command signals to the semiconductor memory device 200a. For example, the memory controller 100 may transmit the data to the semiconductor memory device 200a through the data pin 103, transmit the address signals to the semiconductor memory device 200a through the address pin 102, and transmit the operating command signals to the semiconductor memory device 200a through the command pin 101.

Figure 8:
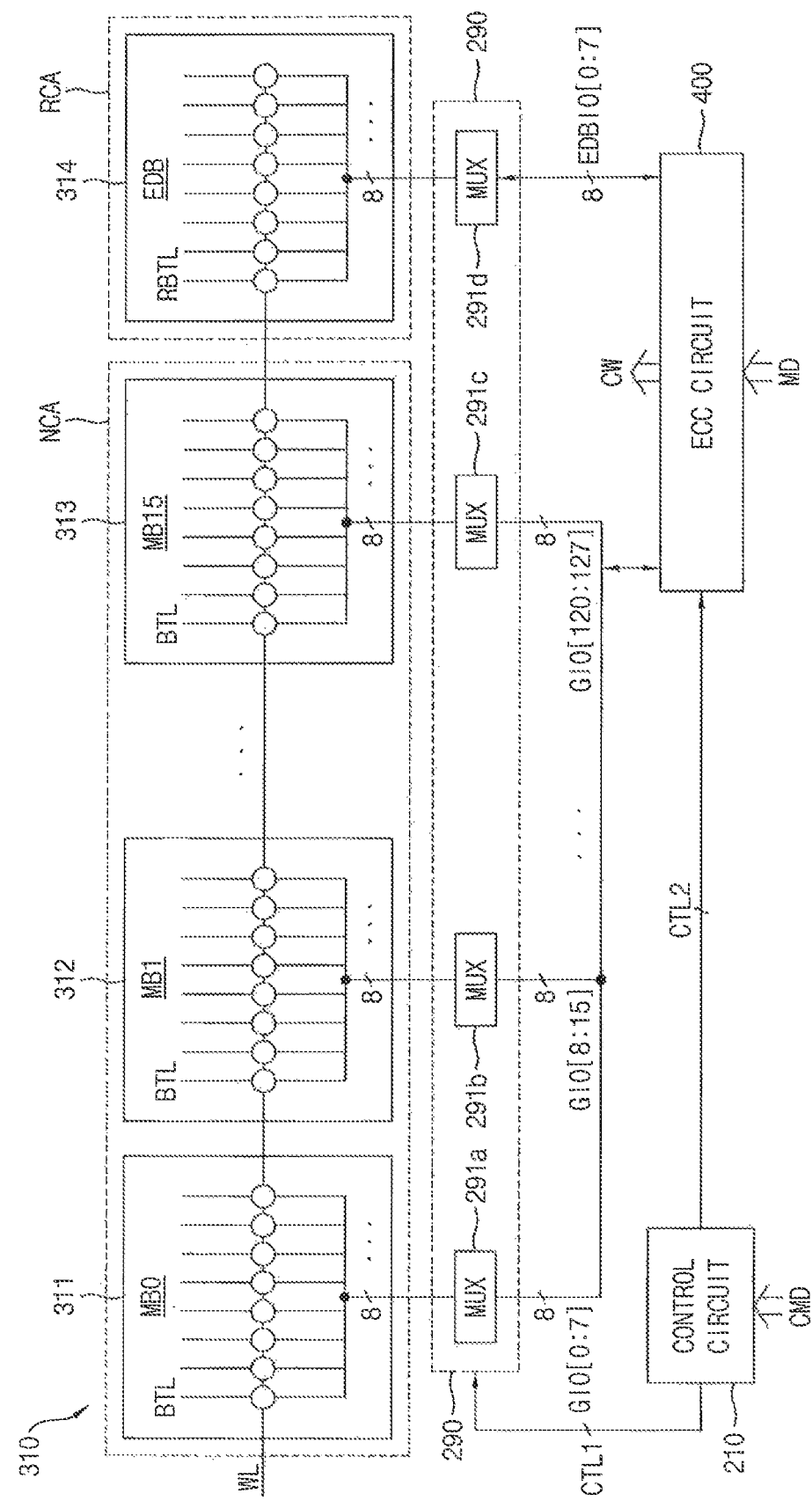
FIG. 8 illustrates a portion of the semiconductor memory device of FIG. 3 in a normal mode.

FIG. 8 illustrates a portion of the semiconductor memory device of FIG. 3 in a normal mode.

In FIG. 8, the control logic circuit 210, the first bank array 310, the I/O gating circuit 290, and the error correction circuit 400 are illustrated. FIG. 8 illustrates the portion of the semiconductor memory device 200a in a write operation of the normal mode.

Referring to FIG. 8, the first bank array 310 includes a normal cell array NCA and a redundancy cell array RCA. The normal cell array NCA includes a plurality of first memory blocks MB0~MB15, i.e., 311~313, and the redundancy cell array RCA includes at least a second memory block 314. The first memory blocks 311~313 are memory blocks determining a memory capacity of the semiconductor memory device 200a. The second memory block 314 is for ECC and/or redundancy repair. Since the second memory block 314 for ECC and/or redundancy repair is used for ECC, data line repair and block repair to repair 'fail' cells (e.g., cells that have malfunctioned) generated in the first memory blocks 311~313, the second memory block 314 is also referred to as an EDB block.

In each of the first memory blocks 311~313, a plurality of first memory cells are arranged in rows and columns. In the second memory block 314, a plurality of second memory cells are arranged in rows and columns.

In the first memory blocks 311~313, rows may be formed, for example, of 8K word-lines WL and columns may be formed, for example, of 1K bit-lines BTL. The first memory cells connected to intersections of the word-lines WL and the bit-lines BTL may be dynamic memory cells or resistive type memory cells. In the second memory block 314, rows may be formed, for example, of 8K word-lines WL and columns may be formed, for example, of 1K bit-lines BTL. The second memory cells connected to intersections of the word-lines WL and the bit-lines RBTL may be dynamic memory cells or resistive type memory cells.

The I/O gating circuit 290 includes a plurality of switching circuit 291a~291d respectively connected to the first memory blocks 311~313 and the second memory block 314. In the semiconductor memory device 200a, bit lines corresponding to data of a burst length (BL) may be simultaneously accessed to support the BL indicating the maximum number of column positions that is accessible. For example, if the BL is set to 8, data bits may be set to 128 bits.

The error correction circuit 400 may be connected to the switching circuits 291a~291d through first data lines GIO [0:127] and second data lines EDBIO[0:7].

The control logic circuit 210 may decode the command CMD to generate the first control signal CTL1 for controlling the switching circuits 291a~291d and the second control signal CTL2 for controlling the error correction circuit 400.

When the command CMD is a write command, the error correction circuit 400 encodes the main data MD to generate a codeword CW including the main data MD and a parity data associated with the main data MD. The I/O gating circuit 290 stores the main data MD in the first memory blocks 311~313 and stores the parity data in the second memory block 314. The parity data may be used to error correct the associated main data MD.

Figure 9:
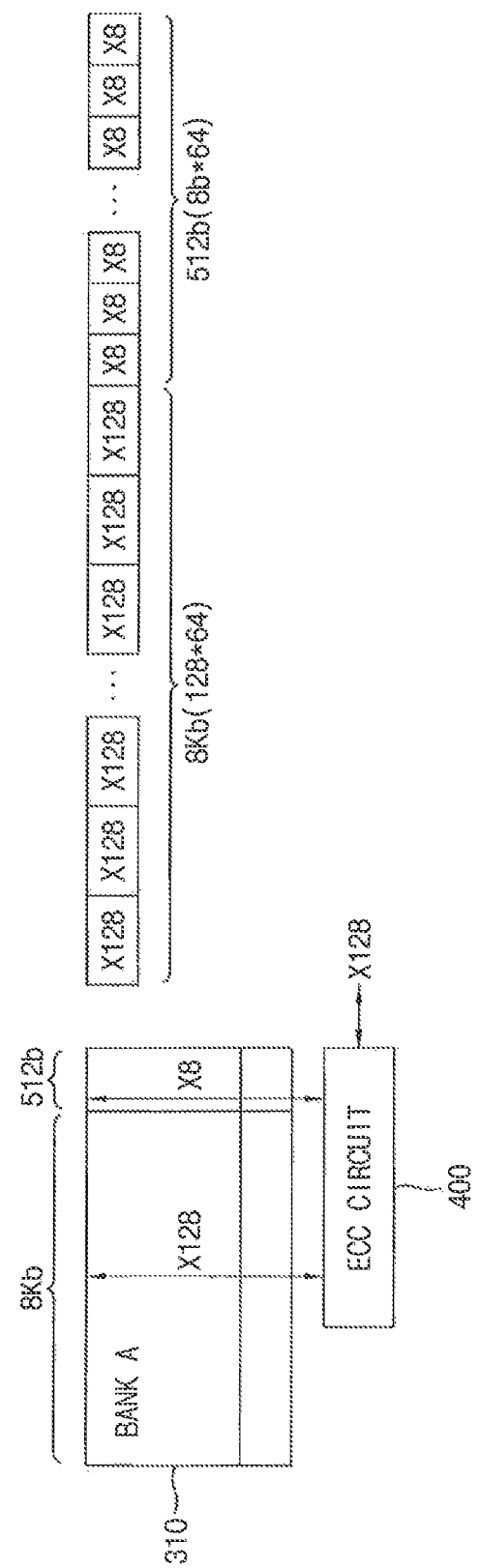
FIG. 9 illustrates a bank array and the error correction circuit shown in the semiconductor memory device of FIG. 3.

FIG. 9 illustrates a bank array and the error correction circuit shown in the semiconductor memory device of FIG. 3.

In FIG. 9, the first bank array 310 is illustrated for convenience, however, the details discussed herein related to the first bank array 310 may equally apply to the other bank arrays 320, 330 and 340.

Referring to FIG. 9, each page of the first bank array 310 has a size of 8 Kb and each sub-page of the page has a size of 128b. Therefore, FIG. 9 illustrates 64 sub-pages. A parity data of 8b is stored for each sub-page. Data from each sub-page of 128b and corresponding parity data of 8b are sequentially read and provided to the error correction circuit 400. A Hamming code may be used by the error correction circuit 400 for error detection and correction. The ECC method and a codeword length used during read/write operations may also be used for the scrubbing operation according to exemplary embodiments.

Figure 10:
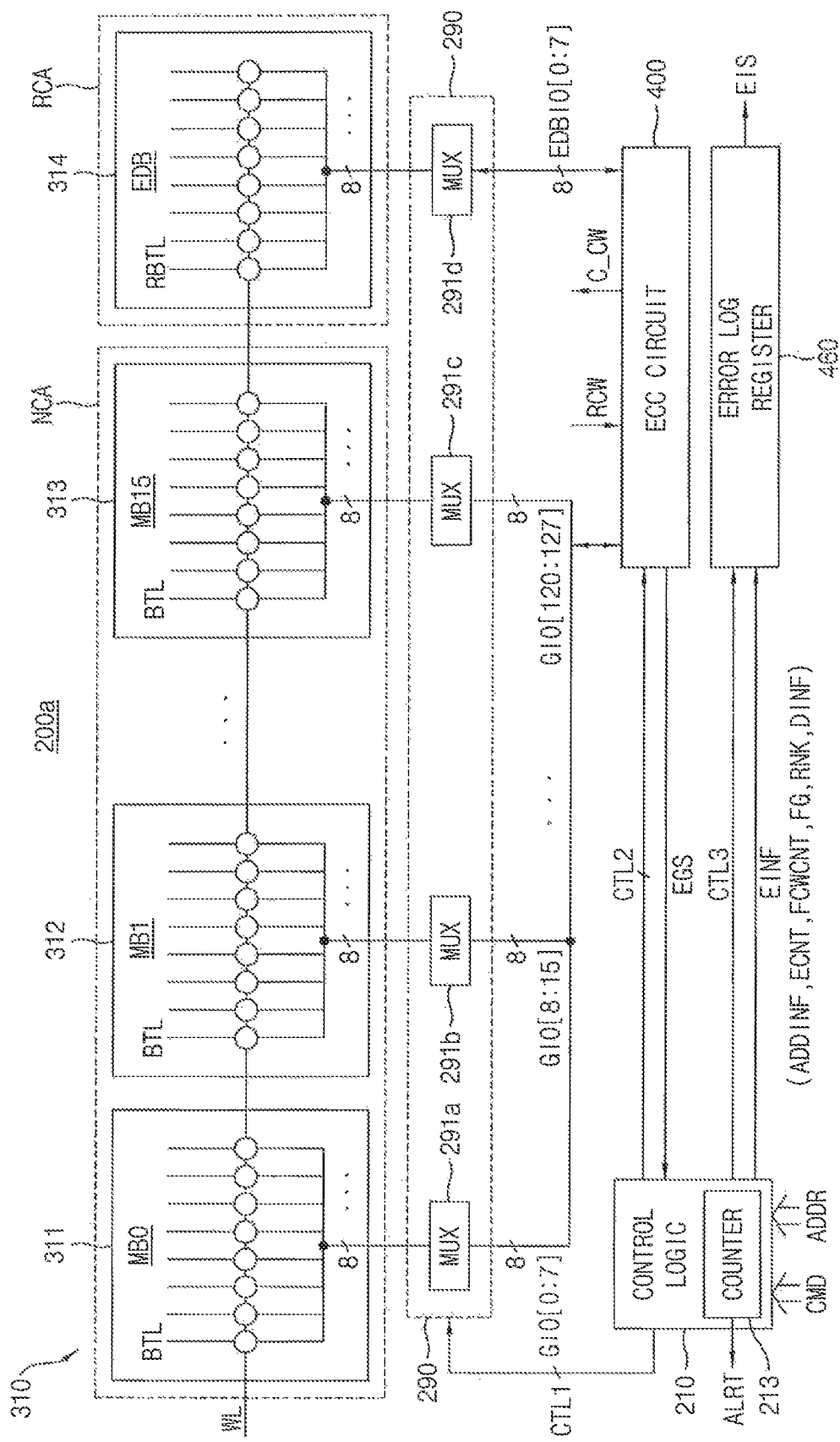
FIG. 10 illustrates a portion of the semiconductor memory device of FIG. 3 in an ECS mode.

FIG. 10 illustrates a portion of the semiconductor memory device of FIG. 3 in an ECS mode according to an exemplary embodiment of the inventive concept.

FIG. 10 illustrates the control logic circuit 210, the first bank array 310, the I/O gating circuit 290, the error correction circuit 400, and the error log register 460.

Referring to FIG. 10, when the command CMD designates the ECS mode, the control logic circuit 210 controls the error correction circuit 400 and the I/O gating circuit 290 to perform the ECC decoding sequentially on each first unit of data including the main data and the parity data from some pages designated by the address ADDR. When the first unit of data includes at least one bit error based on a result of the ECC decoding, the error correction circuit 400 provides the error generation signal EGS to the control logic circuit 210.

When the first unit of data includes at least one bit error, the control logic circuit 210 controls the error correction circuit 400 to perform a scrubbing operation by correcting the at least one bit error bit to generate a corrected first unit of data and writing back the corrected first unit of data to a memory location corresponding to the sub-page. That is, the error correction circuit 400 performs the scrubbing operation by reading a codeword RCW from a sub-page of a first page, correcting at least one bit error in the read codeword RCW to generate a corrected codeword C_CW and writing back the corrected codeword C_CW into a memory location corresponding to the sub-page. The control logic circuit 210 performs an error logging operation to count the error generation signal EGS and to write an error information EINF into the error log register 460. The error information EINF may include at least a number of error occurrences on each of some pages of the memory cell array 300.

The error information EINF may include address information ADDINF, a number of error occurrences ECNT, ranking information RNK, a number of sub-pages including error bits FCWCNT, flag information FG indicating whether the error information EINF is initially written in the error log register 460 and change of error occurrences DINF.

In an embodiment, the control logic circuit 210 notifies the memory controller 100 of the first situation immediately by using an alert signal ALRT via the pin 204. In the first situation, the number of error occurrences in one page reaches the threshold. The memory controller 100 applies the scrubbing command to the semiconductor memory device 200a in response to the alert signal ALRT, and the control logic circuit 210 controls the I/O gating circuit 290 and the error correction circuit 400 to perform the scrubbing operation consecutively on sub-pages of the one page.

When the command CMD is a register read command RDD, the control logic circuit 210 provides the third control signal CTL3 to the error log register 460 such that the error information EINF in the error log register 460 is provided to the memory controller 100 as the error information signal EIS. The semiconductor memory device 200a transmits the error information signal EIS to the memory controller 100 via the data pin 203.

Figures 11, 12:
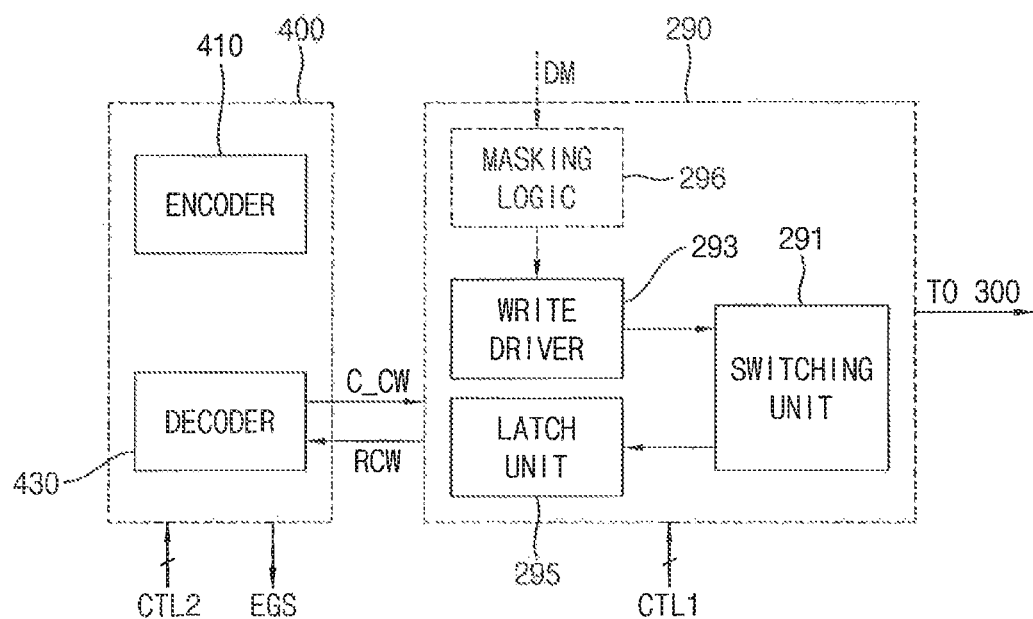
FIG. 11 illustrates the error log register in the semiconductor memory device 200 of FIG. 3.
FIG. 12 illustrates the error correction circuit and the I/O gating circuit in the semiconductor memory device of FIG. 3 in the ECS mode.

FIG. 11 illustrates the error log register in the semiconductor memory device 200 of FIG. 3 according to an exemplary embodiment of the inventive concept.

Referring to FIG. 11, each of indexes (e.g., entries) Idx1, Indx2, . . . , Idxp (p is a natural number greater than two) may include page error information on each of some pages of memory cell array 300. Each entry may correspond to one of the pages. The error log register 460 includes a plurality of columns 461, 462, 463, 464, 465, and 466. In exemplary embodiments, one or more of the columns is omitted.

The first column 461 stores ranking information RNK on ranking of a number of error occurrences based on the number of the error occurrences of each of the some pages. An entry with ranking information RNK having a lowest value (e.g., 1) could be considered a highest rank and an entry with ranking information RNK having a highest value could be considered a lowest rank. For example, a first page associated with idx1 having 2 error occurrences during a given period could receive a RNK of 2 while a second page associated with idx2 could receive a higher RNK of 1 when it has 4 error occurrences during the given period.

The second column 462 stores address information ADDINF of each of the some pages. In an exemplary embodiment, the address information ADDINF includes at least one of a bank group address ('BGA'), a bank address ('BA'), and a row address ('RA'). While FIG. 3 illustrated a single group of bank arrays (e.g., 310-340), additional groups of bank arrays may be present. The bank group address may identify one of these groups. For example, if there is a first group of bank arrays includes bank arrays 310-340 and a second group of bank arrays, and the errors are occurring in the first group, the BGA would identify the first group. The bank address may identify one of the banks of the identified group. The row address may identify a page of the one bank.

The third column 463 stores a number of error occurrences ECNT of each of the some pages. For example, the error log register 460 of FIG. 11 illustrates the number of error occurrences ECNT for a page having address A is 2 and the number of error occurrences ECNT for a page having address B is 4.

The fourth column 464 stores a number of sub-pages FCWCNT including a bit error, of each of the some pages. For example, if a second page has 4 bit errors (ECNT=4), the second page has 64 sub-pages, but only 3 of the 64 sub-pages have bit errors (e.g., sub-pages 1 and 12 each have 1 bit error and sub-page 43 has 2 bit errors), the entry of the second page would have a FCWCNT of 3.

The fifth column 465 stores the flag information FG and the sixth column 466 stores the change of error occurrences DINF of each of the some pages. The ranking information RNK indicates a ranking of a number of error occurrences based on the number of the error occurrences of each of the some pages. The flag information FG indicates whether the error information of the corresponding page is initially written into the error log register 460. When the error information of the corresponding page is initially written into the error log register 460, the flag information FG has a first logic level (e.g., 0). In an embodiment, if the FG of a page has a second logic level (e.g., 1), the page previously had error information.

The change of error occurrences DINF indicates an increase or a decrease of the error occurrences in a same page between a p-th (p is a natural number greater than zero) and a (p+1)-th ECS mode. For example, a DINF of 0 could indicate a decrease in error occurrences, while a DINF of 1 could indicate an increase in error occurrences, over time. For example, if a first page had an ECNT of 4 at time 1 and then has an ECNT of 2 at time 2, then its entry would have a DINF of 0.

For example, the ranking information RNK of a B page whose number of error occurrences is greatest in the p-th ECS mode has a highest ranking in the p-th ECS mode. The memory controller 100 may designate an address of the B page such that the ECS operation is performed on the B page in the (p+1)-th ECS mode. In the (p+1)-th ECS mode, the number of error occurrences ECNT in the B page increases by one, and the change of error occurrences DINF of the B page becomes '1' in the (p+1)-th ECS mode. The memory controller 100 accesses the error log register 460 to determine pages whose probability of error occurrence is higher than other pages. For example, even if two pages currently have a same ECNT, if a first page among the two pages has a DINF that indicates an increased change in error occurrences, it could be concluded that the first page has a higher probability of error than the second page.

The some pages whose page error information is written into the error log register 460 may have a higher probability of error occurrence than other pages. For example, if only pages 1-10 of a group of 12 pages have page error information in 460, then it can be concluded that pages 1-10 have a higher probability of error occurrence as compared to pages 11 and 12. The some pages may be determined through testing the semiconductor memory device 200a or the ECS operation performed before the p-th ECS operation. In an embodiment, the memory controller 100 accesses the error log register 460 to determine how likely pages of the memory cell array 300 are to have error occurrences and manages errors of the semiconductor memory device 200a based on this determination.

FIG. 12 illustrates the error correction circuit and the I/O gating circuit in the semiconductor memory device of FIG. 3 in the ECS mode according to an exemplary embodiment of the inventive concept.

Referring to FIG. 12, the error correction circuit 400 includes an ECC encoder 410 and an ECC decoder 430. The I/O gating circuit 290 includes a switching unit 291, a write driver 293 and a latch unit 295. The I/O gating circuit 290 may further include a masking logic 296. The switching unit 291 may include the switches 291a~291d in FIGS. 8 and 10. The I/O gating circuit 290 may provide the ECC decoder 430 with the read codeword RCW read from a sub-page of a page in the memory cell array 300 in the ECS mode. The ECC decoder 430 may correct a bit error in the read codeword RCW using parity data in the read codeword RCW to generate a corrected codeword C_CW and may provide the corrected codeword C_CW to the I/O gating circuit 290. The I/O gating circuit 290 receives the corrected codeword C_CW from the ECC decoder 430 and writes back the corrected data into a memory location corresponding to the sub-page. The error correction circuit 400 may provide the error generation signal EGS to the control logic circuit 210 whenever an error occurs in the read codeword RCW while the error correction circuit 400 performs the scrubbing operation.

The ECC decoder 430 may perform the above-described scrubbing operation in response to the second control signal CTL2 in the ECS mode.

Figure 13:
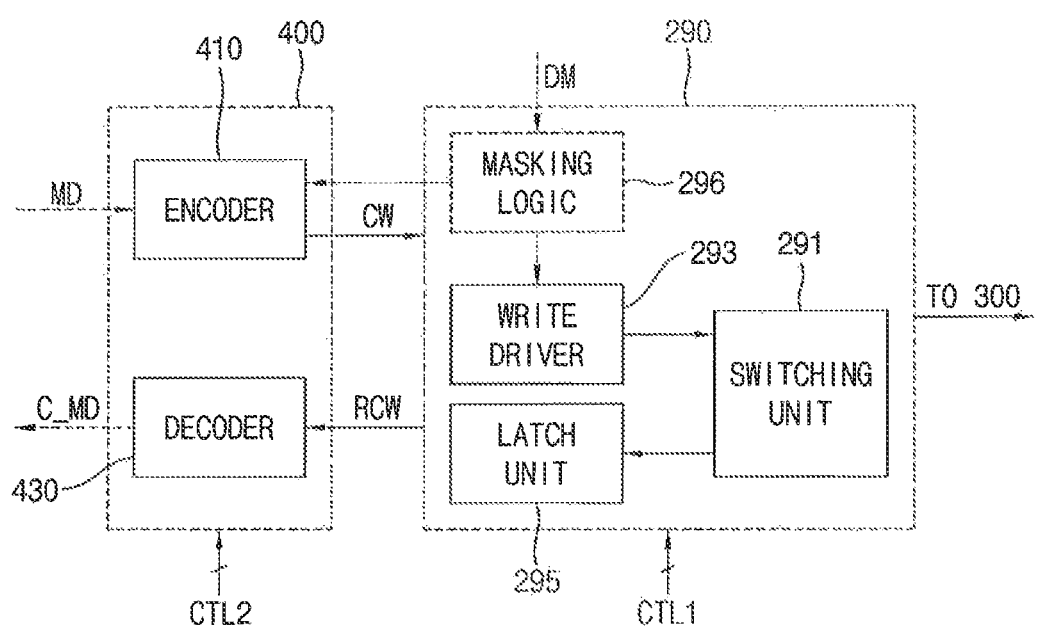
FIG. 13 illustrates the error correction circuit and the I/O gating circuit in the semiconductor memory device of FIG. 3 in the normal mode.

FIG. 13 illustrates the error correction circuit and the I/O gating circuit in the semiconductor memory device of FIG. 3 in the normal mode.

Referring to FIG. 13, in a read operation of the normal mode, the I/O gating circuit 290 provides the ECC decoder 430 with the read codeword RCW read from a sub-page of a target page in the memory cell array 300. In an embodiment, the ECC decoder 430 corrects a bit error in the read codeword RCW using parity data in the read codeword RCW to generate corrected main data C_MD and provides the corrected main data C_MD to the data I/O buffer 299.

In a write operation of the normal mode, the ECC encoder 410 generates rite parity data based on the write main data MD and provides the codeword CW including write main data MD and the write parity data to the I/O gating circuit 290.

The masking logic 296 controls the write driver 293 and the ECC encoder 410 to perform a masked write operation in response to the data mask signal DM from the memory controller 100 in a masked write operation.

Figure 14:
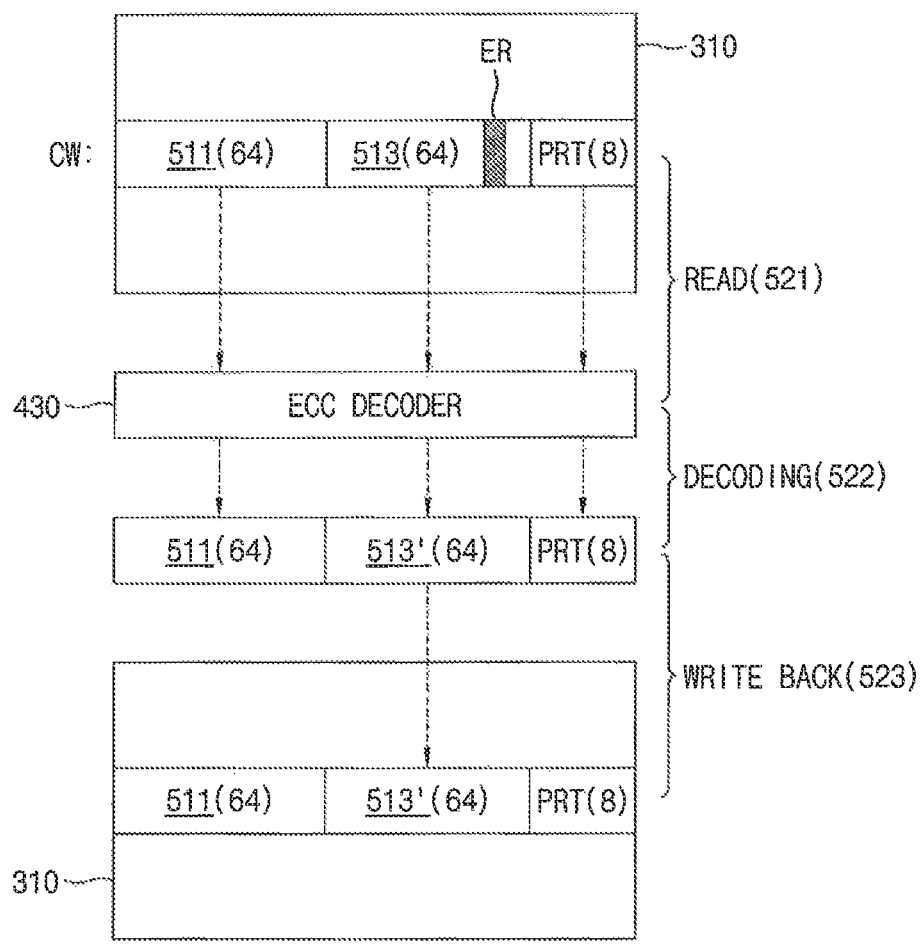
FIG. 14 illustrates that a scrubbing operation is performed in the semiconductor memory device of FIG. 10.

FIG. 14 illustrates that a scrubbing operation is performed in the semiconductor memory device of FIG. 10.

Referring to FIGS. 10, 12 and 14, when the command CMD designates the ECS mode, the I/O gating circuit 290 reads a first unit of codeword including a 64-bit first sub unit of data 511, a 64-bit second sub unit of data 513 and a 8-bit parity data PRT from a sub-page of one page in the bank array 310 and the first unit of codeword CW is provided to the ECC decoder 430 as a reference numeral indicates 521. The second sub unit of data 513 includes an error bit ER. The ECC decoder 430 performs an ECC decoding on the first unit of codeword CW to detect the bit error ER, corrects the detected bit error ER in the second sub unit of data 513 to generate a corrected second sub unit of data 513' and provides the corrected second sub unit of data 513' to the I/O gating circuit 290 as a reference numeral indicates 522. The I/O gating circuit 290 writes back the corrected second sub unit of data 513' into a memory location corresponding to the second sub unit of data 513 of the sub-page as a reference numeral indicates 523. In an exemplary embodiment, the scrubbing operation is performed on the one page in the bank array 310 after it is determined that intensive accesses to a second page adjacent to the one page has occurred for a given time interval. For example, accesses to the second page may be considered intensive when they exceed a pre-determined rate.

Figure 15:
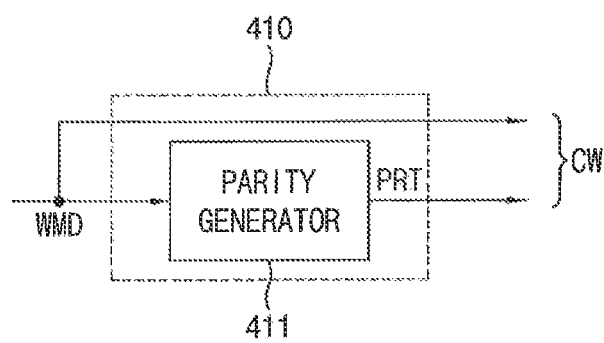
FIG. 15 illustrates the ECC encoder in the error correction circuit in FIG. 13.

FIG. 15 illustrates the ECC encoder in the error correction circuit in FIG. 13.

Referring to FIG. 15, the ECC encoder 410 includes a parity generator 411. The parity generator 411 performs an ECC encoding on the write data WMD to generate the parity data PRT in a write operation and provides the I/O gating circuit 290 with the codeword CW including the write data WMD and the parity data PRT.

Figure 16:
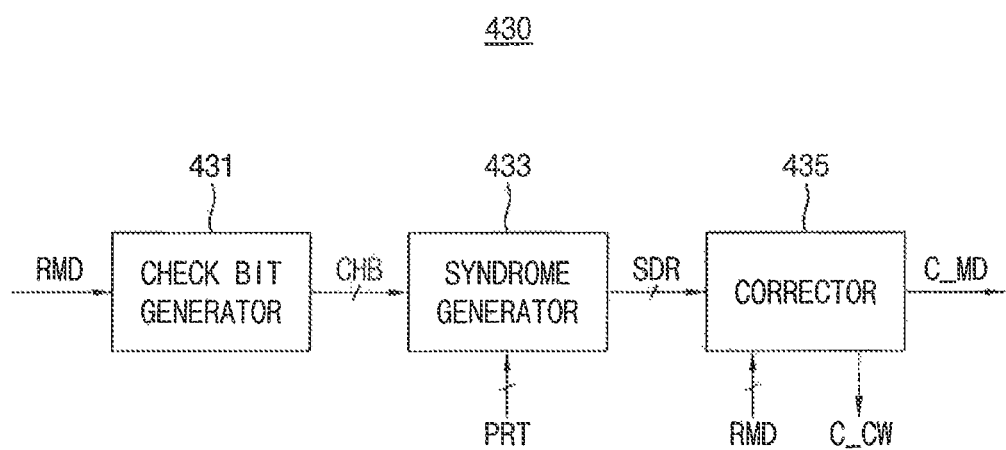
FIG. 16 illustrates the ECC decoder in the error correction circuit in FIGS. 12 and 13.

FIG. 16 illustrates the ECC decoder in the error correction circuit in FIGS. 12 and 13.

Referring to FIG. 16, the ECC decoder 430 includes a check bit generator 431, a syndrome generator 433 and a data corrector 435.

The check bit generator 431 generates check bits CHB based on the read data RMD. The syndrome generator 433 generates a syndrome data SDR based on the check bits CHB and the parity data PRT included in the read codeword. The syndrome data SDR may indicate whether the read data RMD includes at least one bit error and may also indicate a position of the bit error. The data corrector 435 may correct the bit error in the read data RMD based on the syndrome data SDR, may provide the corrected codeword C_CW to the I/O gating circuit 290 in a scrubbing mode and may provide the corrected main data C_MD to the data I/O buffer 299 in a read operation.

Figure 17:
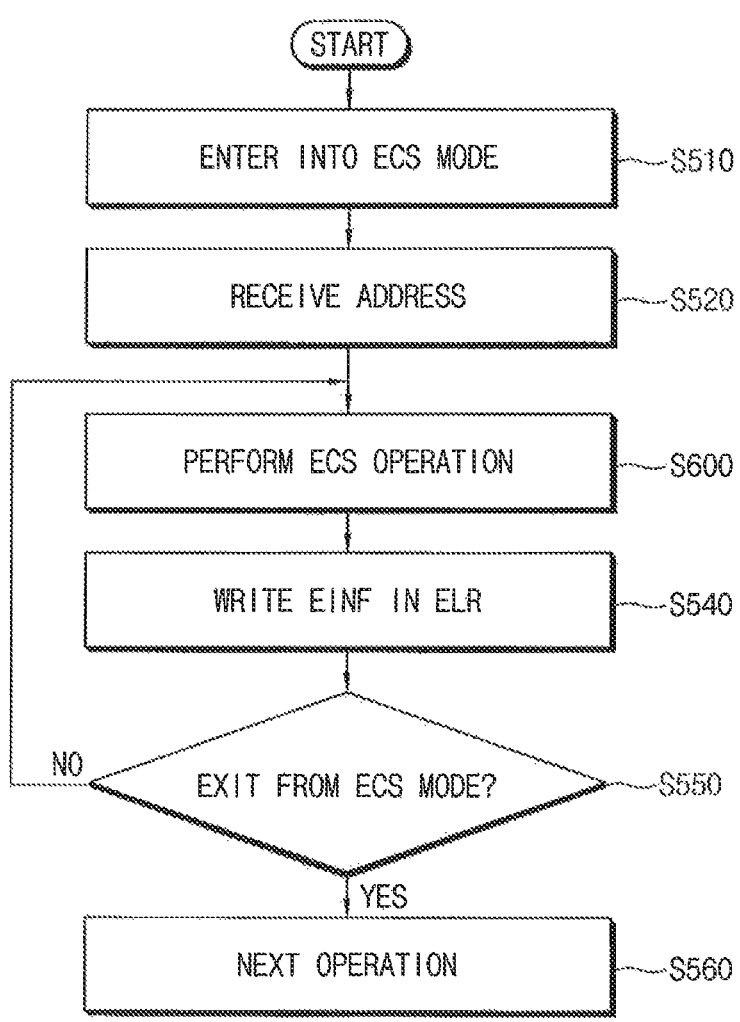
FIG. 17 is a flow chart illustrating a method of operating a semiconductor memory device according to an exemplary embodiment of the inventive concept.

FIG. 17 is a flow chart illustrating a method of operating a semiconductor memory device according to an exemplary embodiment of the inventive concept.

Referring to FIGS. 2, 3, 10, 11, 12, 14, 16 and 17, in a method of operating a semiconductor memory device 200a that includes a memory cell array 300, an error correction circuit 400 and an error log register 460, the semiconductor memory device 200a enters into an ECS mode in response to the command CMD from the memory controller 100 (S510). For example, the command CMD may be received through command pin 201 of the semiconductor memory device 200a. The semiconductor memory device 200a receives an address ADDR to be scrubbed simultaneously or sequentially when the semiconductor memory device 200a enters into the ECS mode (S520). The address ADDR may designate some pages of the memory cell array 300 to be scrubbed simultaneously or sequentially.

The control logic circuit 210 controls the I/O gating circuit 290 and the error correction circuit to perform an ECS operation on a first page of the some pages designated by the address ADDR (S600). The ECS operation may include the ECC decoding operation and the scrubbing operation. The ECC decoding operation may used to detect bit errors in a page of memory corresponding to the address ADDR and the scrubbing operation may be used to correct the bit errors and write back the corrected data to the page.

The control logic circuit 210 writes the page error information EINF of each of the some pages into the error log register 460 ('ELR') according to results of the ECS operation (S540). The control logic circuit 210 determines whether the ECS operation has completed on all of the some pages designated by the address ADDR (S550). When the ECS operation has not completed on all of the some pages (NO in S550), the ECC decoding operation and the error logging operation are performed on a second page of the some pages. When the ECS operation has completed (YES in S550), the semiconductor memory device 200a performs a next memory operation in response to a next command from the memory controller 100.

Figure 18:
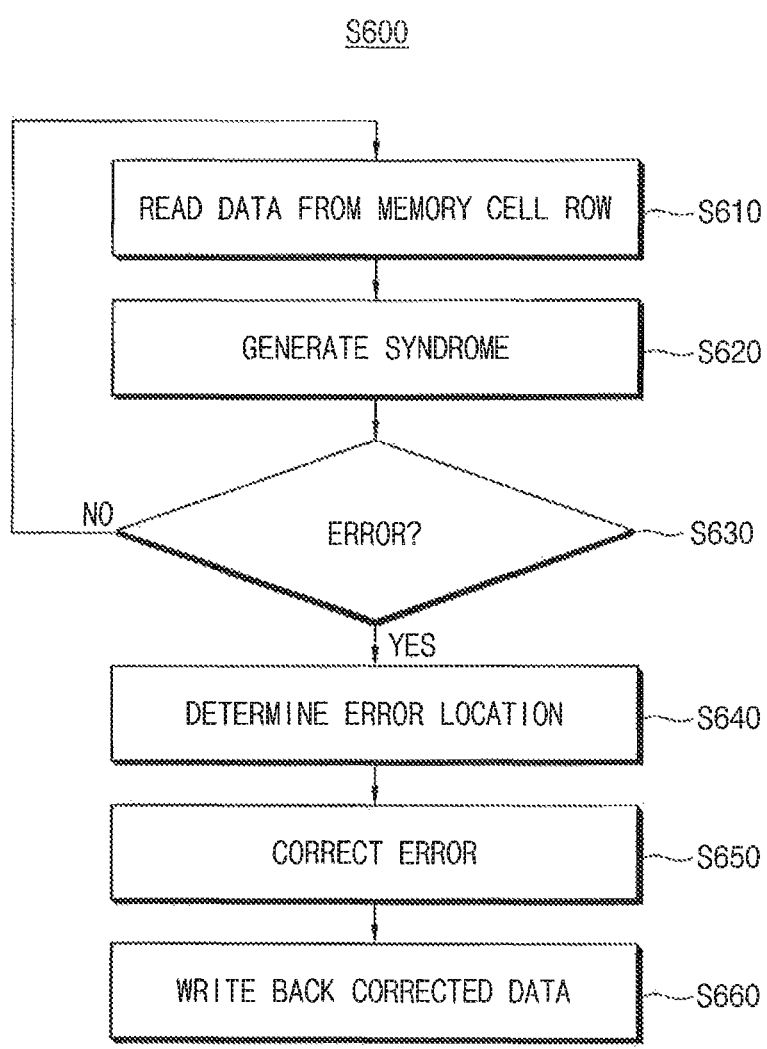
FIG. 18 is a flow chart illustrating the ECS operation in the method of FIG. 17 according to an exemplary embodiment of the inventive concept.

FIG. 18 is a flow chart illustrating the ECS operation in the method of FIG. 17 according to an exemplary embodiment of the inventive concept.

Referring to FIGS. 3, 10, 11, 12, 14, 16, 17, and 18, at least one sub-page of the first page designated by the address ADDR is selected and a first unit CW of data including the main data MD and the parity data PRT is read from the selected sub-page (S610).

The ECC decoder 430 generates the syndrome data SDR (S620) to determine whether the first unit of data CW includes a bit error (S630). The syndrome generator 433 generates the syndrome data SDR by checking whether each corresponding bit of the check bits CHB and the parity data PRT is identical to each other. The first unit of data CW includes a bit error when at least one bit of the syndrome data SDR is not '0'.

When the first unit of data CW includes a bit error (YES in S630), the ECC decoder 430 determines a location of at least bit one error based on the syndrome data SDR (S640), corrects the at least one bit error based on the parity data PRT in the first unit of data to generate a corrected codeword C_CW (S650), and provides the corrected codeword C_CW to the I/O gating circuit 290. The I/O gating circuit 290 writes back the corrected codeword C_CW into a memory location corresponding to the sub-page (S660).

When the first unit of data CW does not include a bit error (NO in S630), the error correction circuit 400 performs the above-described operation on next sub-page.

Figure 19:
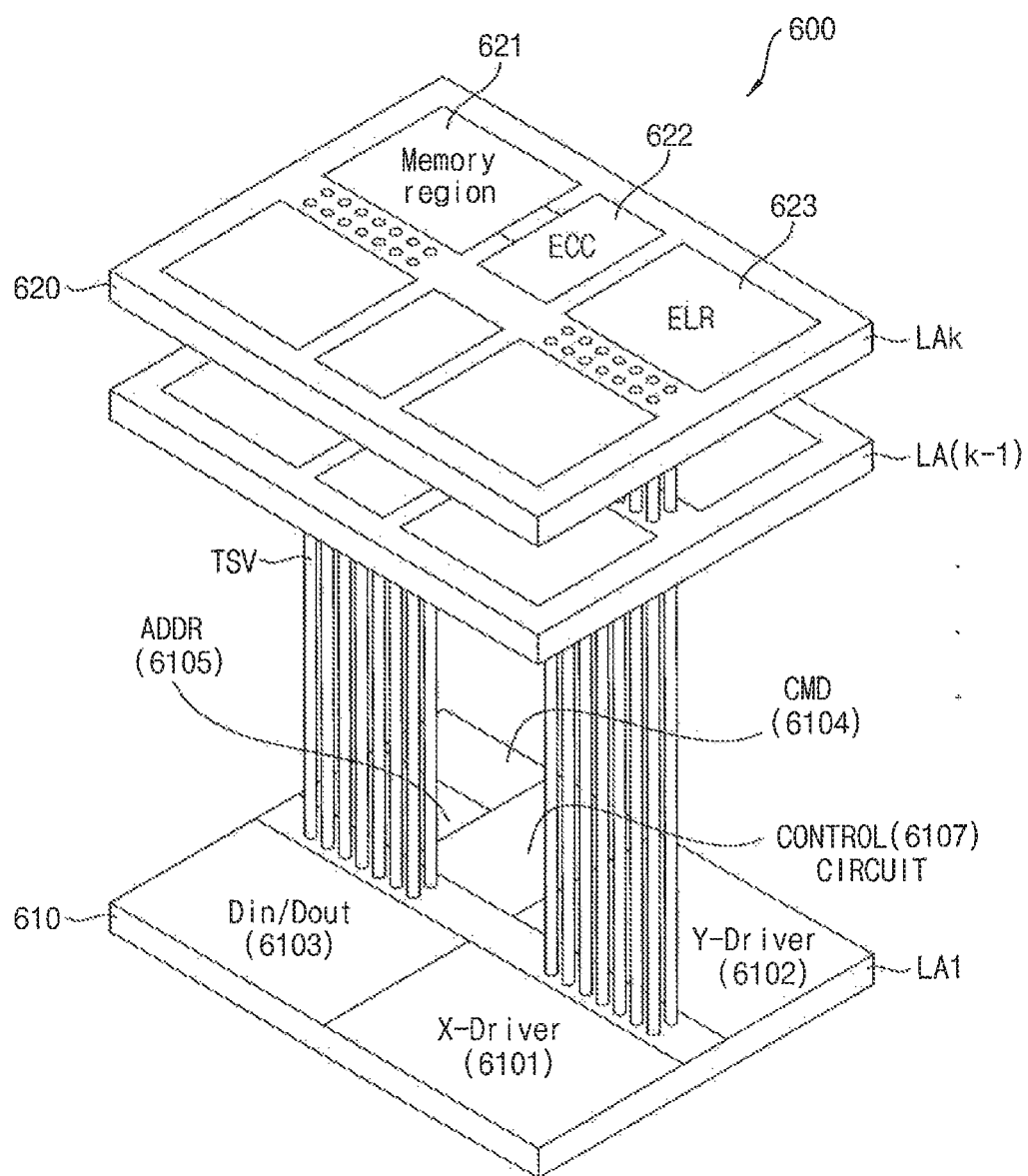
FIG. 19 is a structural diagram illustrating a semiconductor memory device according to an exemplary embodiment of the inventive concept.

FIG. 19 is a structural diagram illustrating a semiconductor memory device according to an exemplary embodiment of the inventive concept.

Referring to FIG. 19, a semiconductor memory device 600 includes first through kth semiconductor integrated circuit layers LA1 through Lak (k is an integer equal to or greater than three), in which the lowest first semiconductor integrated circuit layer LA1 is assumed to be an interface or control chip and the other semiconductor integrated circuit layers LA2 through LAk are assumed to be slave chips including core memory chips. The first through kth semiconductor integrated circuit layers LA1 through LAk may transmit and receive signals therebetween through through-silicon-vias (TSVs). The lowest first semiconductor integrated circuit layer LA1 as the interface or control chip may communicate with an external memory controller through a conductive structure formed on an external surface. A description will be made regarding structure and an operation of the semiconductor memory device 600 by mainly using the first semiconductor integrated circuit layer LA1 or 610 as the interface or control chip and the nth semiconductor integrated circuit layer LAk or 620 as the slave chip.

The first semiconductor integrated circuit layer 610 may include various peripheral circuits for driving memory region 621 provided in the kth semiconductor integrated circuit layer 620. For example, the first semiconductor integrated circuit layer 610 may include a row (X)-driver 6101 for driving word-lines of a memory, a column (Y)-driver 6102 for driving bit-lines of the memory, a data input/output unit (Din/Dout) 6103 for controlling input/output of data, a command buffer (CMD) 6104 for receiving a command CMD from an outside source and buffering the command CMD, and an address buffer (ADDR) 6105 for receiving an address from an outside source and buffering the address. The memory region 621 may include a plurality of bank arrays in which a plurality of memory cells are arranged as described with reference to FIG. 3.

The first semiconductor integrated circuit layer 610 may further include a control logic (circuit) 6107. The control logic 6107 may access the memory region 621 and may generate control signals for accessing the memory region 621 based on the command from the memory controller.

The kth semiconductor integrated circuit layer 620 includes an error correction circuit 622 that performs an ECC encoding on data to be stored in the memory region 621 and performs an ECC decoding on data read from the memory region 621. The kth semiconductor integrated circuit layer 620 further includes an error log register 623. The error correction circuit 622, in the ECS mode, activates one page of the memory region 621, selects a sub-page of the activated page and performs a scrubbing operation on the activated one page to read a first unit of data including a main data and a parity data, to correct a bit error of a sub-unit of data of the first unit of data to generate a corrected sub-unit of data and to write back the corrected sub-unit of data into a memory location corresponding to the sub-page.

In an embodiment, the error correction circuit 622 provides the error generation signal EGS to the control logic circuit 6107 whenever an error occurs in the first unit of data while the error correction circuit 400 performs the scrubbing operation. The control logic circuit 6107 may performs the ECS operation on the some pages of the memory region 621 and may write the error information including at least the number of error occurrences in each of the some pages in the error log register 623.

Figure 20:
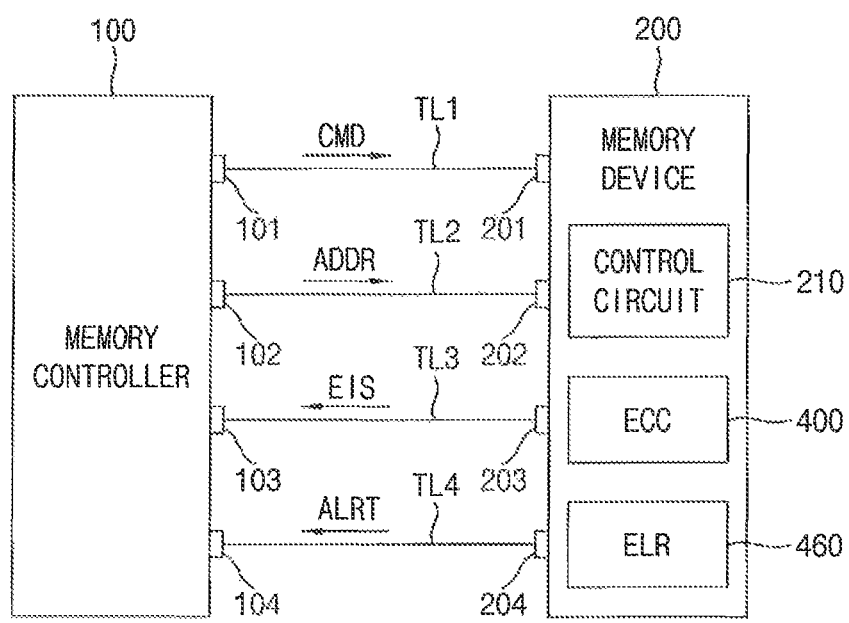
FIG. 20 illustrates the memory system of FIG. 2 in the ECS mode.

FIG. 20 illustrates the memory system of FIG. 2 in the ECS mode.

Figure 21:
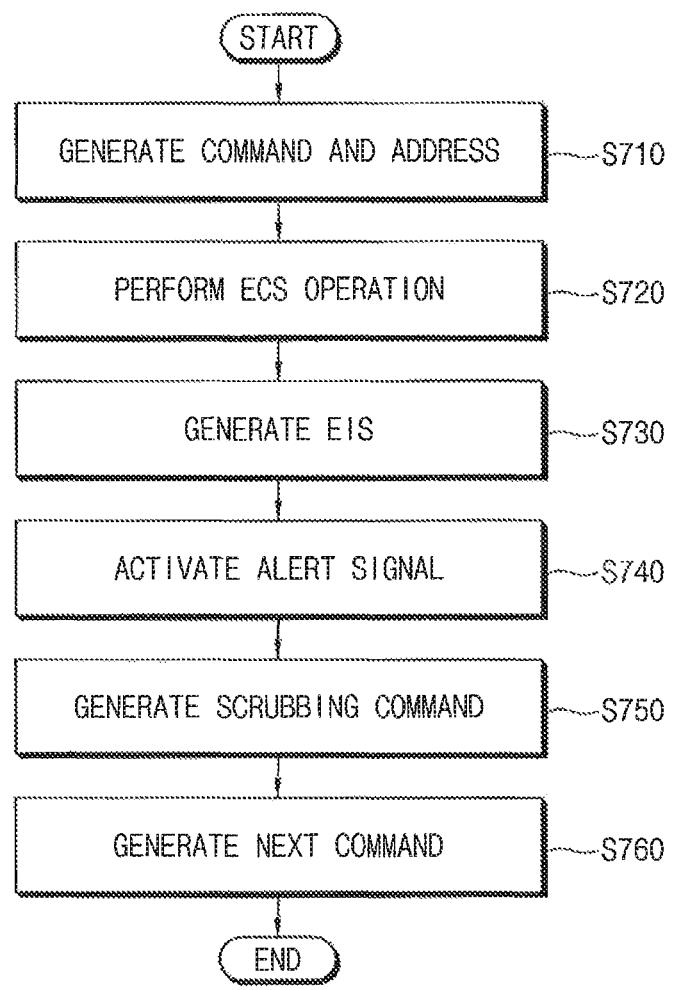
FIG. 21 is a flow chart illustrating a method of operating a memory system according to an exemplary embodiment of the inventive concept.

FIG. 21 is a flow chart illustrating a method of operating a memory system according to an exemplary embodiment of the inventive concept.

Referring to FIGS. 20 and 21, in the memory system 20 and in a method of operating a memory system, the memory controller 100 generates a command (a first command) designating the ECS mode and an address (a first address) ADDR designating at least two pages to be scrubbed on the semiconductor memory device 200 (S710). The semiconductor memory device 200 enters into the ECS mode upon receipt of the first command from the memory controller 100. For example, the first command may be received by the semiconductor memory device 200 through command pin 201.

In the ECS mode, the control logic circuit 210 controls the error correction circuit 400 to perform the ECS operation including the ECC decoding operation and the scrubbing operation on the at least two pages (S720). The error correction circuit 400 reads the first unit of data from each sub-page of a first page of the at least two pages, performs the ECC decoding on the first unit of data, provides the error generating signal EGS to the control logic circuit 210 when the first unit of data includes at least one bit error, corrects the at least one bit error and writes back the corrected first unit of data into a memory location corresponding to the sub-page. The control logic circuit 210 may write page error information in the error log register 460 while the control logic circuit 210 controls the error correction 400 to perform the ECS operation on the first page.

The control logic circuit 210 controls the error correction circuit 400 to perform the ECS operation on a second page of the at least two pages after the ECS operation on the first page has completed.

When the page error information on the at least two pages is written into the error log register 460, the memory controller 100 applies the register read command to the semiconductor memory device 200 and the control logic circuit 210 provides the memory controller 100 with the page error information as the error information signal EIS in response to the register read command (S730). The memory controller 100 may access the error information in the error log register 460 and the semiconductor memory device 200a transmits the error information signal EIS to the memory controller 100 via the data pin 203.

While the control logic circuit 210 writes the page error information in the error log register 460, the control logic circuit 210 may notify the memory controller 100 of a first situation immediately by activating the alert signal ALRT and outputting the activated alert signal ALRT via the pin 204 (S740). The first situation occurs when the number of error occurrences in at least one page reaches the threshold. The alert signal ALRT may be activated by changing a level of the alert signal ALRT from a deactivated logic level to an activated other logic level, and maintaining the activated logic level for a first time interval. The memory controller 100 applies the scrubbing command (S750) to the semiconductor memory device 200a in response to the alert signal ALRT, and the control logic circuit 210 controls the I/O gating circuit 290 and the error correction circuit 400 to perform the scrubbing operation consecutively on sub-pages of the one page.

When the ECS operation has completed on the at least two pages, the memory controller 100 generates a next command for output to the semiconductor memory device 200a, which directs a next operation of the semiconductor memory device 200a (S760). If the next operation does not relate to scrubbing, the semiconductor memory device 200a exits the ECS mode. Alternatively, the memory controller 100 generates a command (a second command) designating the ECS mode and an address (a second address) ADDR designating at least two pages to be scrubbed on the semiconductor memory device 200a so the semiconductor memory device 200a can enter into the ECS mode or remain in the ECS mode.

Figure 22:
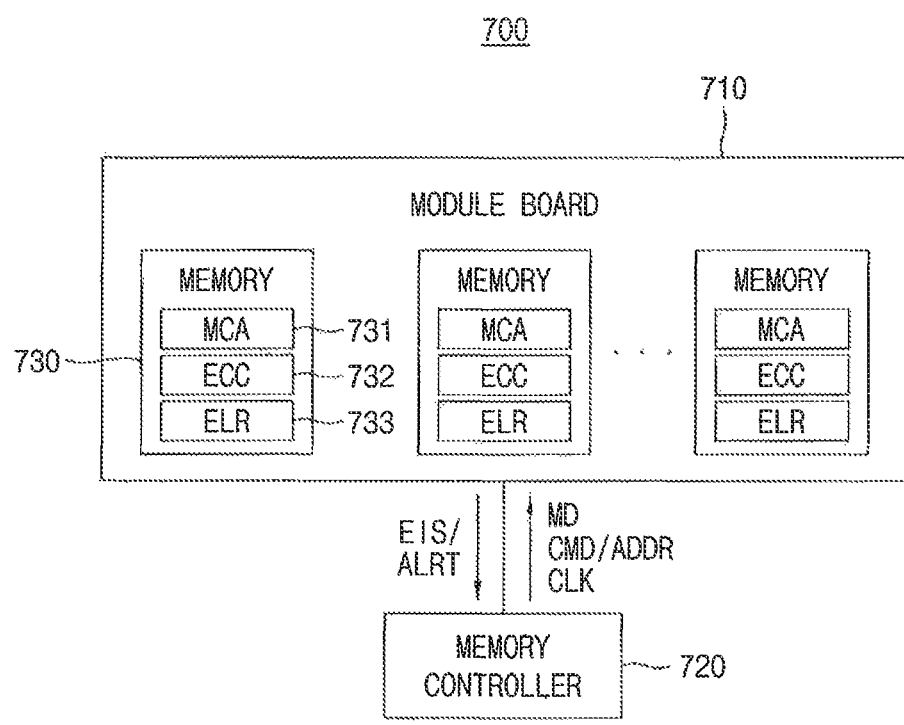
FIG. 22 illustrates a memory system including the semiconductor memory device according to an exemplary embodiment of the inventive concept.

FIG. 22 illustrates a memory system including the semiconductor memory device according to an exemplary embodiment of the inventive concept.

Referring to FIG. 22, a memory system 700 includes a memory module 710 and a memory controller 720. The memory module 710 may include at least one semiconductor memory devices 730 mounted on a module board. The semiconductor memory devices 730 may employ the semiconductor memory device 200a of FIG. 3.

Therefore, each of the semiconductor memory devices 730 may include a memory cell array 731, an error correction circuit 732 and an error log register 733. Each of the semiconductor memory devices 730 performs the ECS operation on some pages of the memory cell array 731, provides the memory controller 720 with error information of each of the some pages as an error information signal EIS and notifies the memory controller 720 of a situation by using an alert signal ALRT, in which the number of error occurrences in one page of the some pages reaches the threshold. The memory controller 720 may determine an error management policy on fault pages of each of the semiconductor memory devices 730, based on the error information signal EIS. The fault pages may be those pages that include more bit error than other pages or more bit errors than a reference number of bit errors. The memory controller 720 may apply the scrubbing command for a fault page to a corresponding semiconductor memory device in response to the alert signal ALRT and the corresponding semiconductor memory device may then perform the scrubbing operation on the corresponding fault page immediately in response the applied scrubbing command.

In an exemplary embodiment of the present inventive concept, a three dimensional (3D) memory array is provided in semiconductor memory devices 730. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. The following patent documents, which are hereby incorporated by reference, describe suitable configurations for the 3D memory arrays, in which the three-dimensional memory array is configured as a plurality of levels, with word-lines and/or bit-lines shared between levels: U.S. Pat. Nos. 7,679,133; 8,553,466; 8,654,587; 8,559,235; and US Pat. Pub. No. 2011/0233648, which are hereby incorporated by reference in their entirety.

The memory module 710 may communicate with the memory controller 720 via a system bus. Main data MD, a command/address CMD/ADDR, and a clock signal CLK may be transmitted and received between the memory module 710 and the memory controller 720 via the system bus. The semiconductor memory device 730 may transmit the error information signal EIS and the alert signal ALRT to the memory controller 720.

Figure 23:
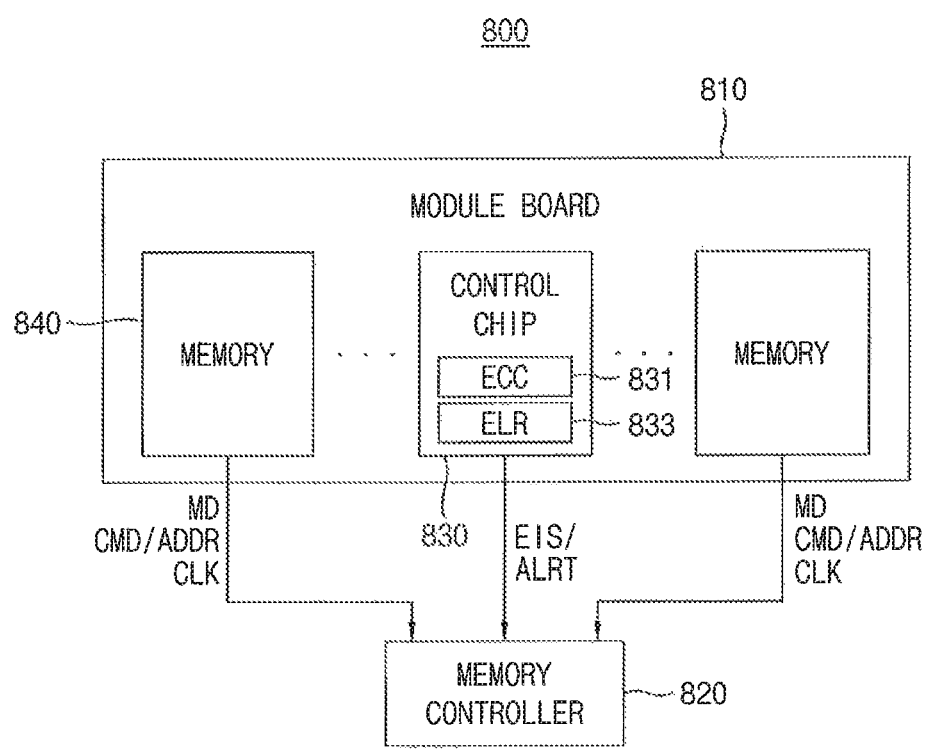
FIG. 23 illustrates a memory system including the semiconductor memory device according to an exemplary embodiment of the inventive concept.

FIG. 23 illustrates a memory system including the semiconductor memory device according to an exemplary embodiment of the inventive concept.

Referring to FIG. 23, a memory system 800 includes a memory module 810 and a memory controller 820. The memory module 810 may include at least one memory chip 840 and a control chip 830. Each of the memory chips 840 stores data MD based on a command CMD, an address ADDR and a clock signal CLK and provides the data MD to the memory controller 820. Each of the memory chips 840 may employ the semiconductor memory device 200a of FIG. 3.

The control chip 830 may control the memory chips 840 in response to signals from the memory controller 820. The control chip 830 may activate at least one of the memory chips 840 in response to a chip selection signal. The control chip 830 may include an error correction circuit 831 and an error log register 833. The control chip 830 may perform an ECC decoding on the data read from each of the memory chips 840. The control chip 830 performs the ECS operation on some pages in the selected memory chip in the ECS mode and writes error information of the some pages in the error log register 833. The error log register 833 may be assigned to each of the memory chips 840. In an embodiment, a single error log register 833 is assigned to the memory chips 840. When the single error log register 833 is assigned to the memory chips 840, the error log register 833 may include a column that stores memory identification information designating the selected memory chip in addition to the information in the error log register 460 of FIG. 11.

The control chip 830 may provide the memory controller 820 with the error information on each of the memory chips 840 with the error information signal EIS. When the number of the error occurrences in the selected memory chip reaches a threshold, the control chip 830 notifies the memory controller 820 of the situation immediately using the alert signal ALRT and the memory controller 820 applies the scrubbing command to the selected memory chip immediately.

The memory controller 820 determines the error management policy of the memory chips 840 based on the error information signal EIS. When errors in one of the memory chips 840 increases beyond the management capability, the memory controller 820 may chip-kill the one memory chip. In an embodiment, when errors in a first chip among the memory chips 840 increases beyond the management capability, the memory controller 820 replaces the first chip with an second one of the memory chips 840. For example, in this replacement, all data without errors and data that could be corrected are copied from the first chip to the second chip. In another embodiment, data that would normally be stored in a portion of the first chip that exceeds the management capability is instead stored in the second chip, and then subsequently accessed from the second chip.

Figure 24:
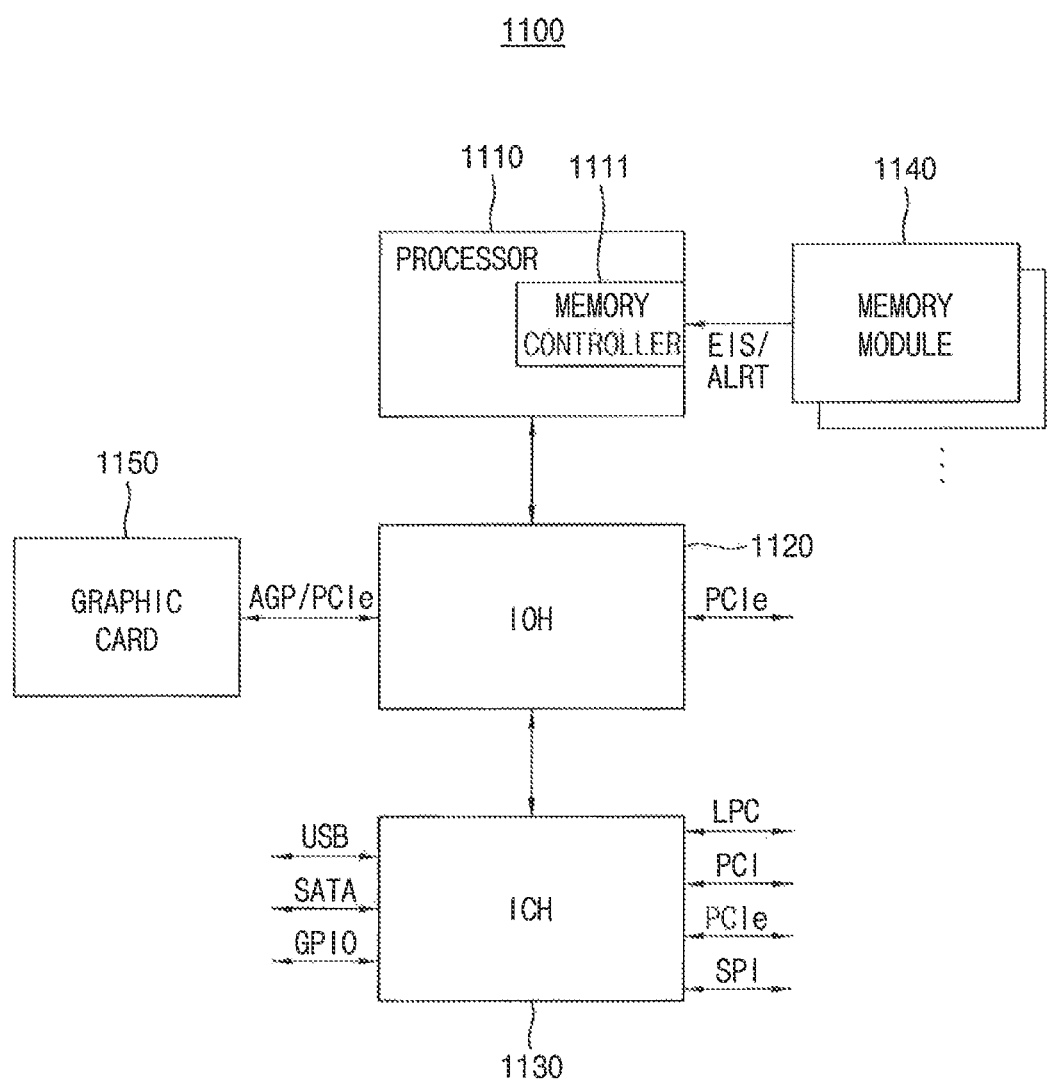
FIG. 24 is a block diagram illustrating a computing system including the semiconductor memory device according to an exemplary embodiment of the inventive concept.

FIG. 24 is a block diagram illustrating a computing system including the semiconductor memory device (e.g., 200a, 200, etc.) according to an exemplary embodiment of the inventive concept.

Referring to FIG. 24, a computing system 1100 includes a processor 1110, an input/output hub (IOH) 1120, an input/output controller hub (ICH) 1130, at least one memory module 1140 and a graphics card 1150. In some embodiments, the computing system 1100 may be a personal computer (PC), a server computer, a workstation, a laptop computer, a mobile phone, a smart phone, a personal digital assistant (PDA), a portable multimedia player (PMP), a digital camera, a digital television, a set-top box, a music player, a portable game console, a navigation system, etc.

The processor 1110 may perform various computing functions, such as executing specific software for performing specific calculations or tasks. For example, the processor 1110 may be a microprocessor, a central processing unit (CPU), a digital signal processor, or the like. In some embodiments, the processor 1110 may include a single core or multiple cores. For example, the processor 1110 may be a multi-core processor, such as a dual-core processor, a quad-core processor, a hexa-core processor, etc. Although FIG. 24 illustrates the computing system 1100 including one processor 1110, in an embodiment, the computing system 1100 includes a plurality of processors. The processor 1110 may include an internal or external cache memory.

The processor 1110 includes a memory controller 1111 for controlling operations of the memory module 1140. The memory controller 1111 included in the processor 1110 may be referred to as an integrated memory controller (IMC). A memory interface between the memory controller 1111 and the memory module 1140 may be implemented with a single channel including a plurality of signal lines, or may be implemented with multiple channels, to each of which at least one memory module 1140 may be coupled. In an embodiment, the memory controller 1111 is located inside the input/output hub 1120, which may be referred to as a memory controller hub (MCH).

The memory module 1140 may include a plurality of semiconductor memory devices that store data provided from the memory controller 1111. Each of the plurality of semiconductor memory devices may employ the semiconductor memory device 200a of FIG. 3. Therefore, each of the plurality of semiconductor memory devices may include a memory cell array, a control logic circuit, an error correction circuit and an error log register as described with reference to FIGS. 2 through 19. Each of the semiconductor memory devices performs the ECS operation including the scrubbing operation and the error logging operation to provide the error information signal EIS and the alert signal ALRT to the memory controller 1111. The memory controller 1111 determines the error management policy of the semiconductor memory devices based on the error information signal EIS.

The input/output hub 1120 may manage data transfer between the processor 1110 and devices, such as the graphics card 1150. The input/output hub 1120 may be coupled to the processor 1110 via various interfaces. For example, the interface between the processor 1110 and the input/output hub 1120 may be a front side bus (FSB), a system bus, a HyperTransport, a lightning data transport (LDT), a QuickPath interconnect (QPI), a common system interface (CSI), etc. Although FIG. 24 illustrates the computing system 1100 including one input/output hub 1120, in an embodiment, the computing system 1100 includes a plurality of input/output hubs.

The input/output hub 1120 may provide various interfaces with the devices. For example, the input/output hub 1120 may provide an accelerated graphics port (AGP) interface, a peripheral component interface-express (PCIe), a communications streaming architecture (CSA) interface, etc.

The graphics card 1150 may be coupled to the input/output hub 1120 via AGP or PCIe. The graphics card 1150 may control a display device (not shown) for displaying an image. The graphics card 1150 may include an internal processor for processing image data and an internal semiconductor memory device. In an embodiment, the input/output hub 1120 includes an internal graphics device along with or instead of the graphics card 1150 disposed outside the input/output hub 1120. The graphics device included in the input/output hub 1120 may be referred to as integrated graphics. Further, the input/output hub 1120 including the internal memory controller and the internal graphics device may be referred to as a graphics and memory controller hub (GMCH).

The input/output controller hub 1130 may perform data buffering and interface arbitration to efficiently operate various system interfaces. The input/output controller hub 1130 may be coupled to the input/output hub 1120 via an internal bus, such as a direct media interface (DMI), a hub interface, an enterprise Southbridge interface (ESI), PCIe, etc. The input/output controller hub 1130 may provide various interfaces with peripheral devices. For example, the input/output controller hub 1130 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In an embodiment, the processor 1110, the input/output hub 1120 and the input/output controller hub 1130 are implemented as separate chipsets or separate integrated circuits. In an embodiment, at least two of the processor 1110, the input/output hub 1120 and the input/output controller hub 1130 are implemented as a single chipset.

Aspects of the present inventive concept may be applied to systems using semiconductor memory devices. For example aspects of the present inventive concept may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, or other such electronic devices.

The foregoing is illustrative of exemplary embodiments and is not to be construed as limiting thereof. Although a few example embodiments have been described, those skilled in the art will readily appreciate that many modifications are possible in the exemplary embodiments without materially departing from the present inventive concept. Accordingly, all such modifications are intended to be included within the scope of the present inventive concept.

What is claimed is:

1. A semiconductor memory device comprising:
a memory cell array including a plurality of memory bank arrays, wherein each memory bank array includes a plurality of memory cell rows, wherein each of the memory cell rows includes a plurality of sub-pages to store a plurality of codewords, each codeword including a main data and a parity data associated with the main data; an error correction circuit; an error log register; and
a control logic circuit configured to control the error correction circuit to perform an error correction code (ECC) decoding sequentially on the sub-pages for detecting at least one bit error in each of the memory cell rows, in response to a first command from a memory controller in an error check and scrub (ECS) mode,
wherein the control logic circuit is configured to perform an error logging operation to write error information into the error log register, and wherein the error information includes a number of faulty codewords in each of some faulty memory cell rows, which is determined by the control logic circuit, wherein the at least one bit error is detected in each of the faulty codewords.

2. The semiconductor memory device of claim 1, wherein the control logic circuit is configured to control the error correction circuit to read a codeword unit of data including the main data and the parity data from each of a plurality memory locations in a first memory cell row of the memory cell rows and to perform the ECC decoding on each codeword unit of data sequentially, and wherein the error correction circuit is configured to provide the error generation signal to the control logic circuit when the codeword unit of data includes at least one bit error based on a result of the ECC decoding.

3. The semiconductor memory device of claim 2, wherein when the codeword unit of data includes the at least one bit error, the control logic circuit is configured to control the error correction circuit to perform a scrubbing operation to correct the at least one bit error and write back the corrected codeword unit of data to a memory location in which the codeword unit of data is stored.

4. The semiconductor memory device of claim 1, wherein the first command is an ECS entry command designating the ECS mode.

5. The semiconductor memory device of claim 1, wherein the first command is a refresh command and the control logic circuit is configured to control the error correction circuit to perform an ECS operation in response to the refresh command.

6. The semiconductor memory device of claim 5, wherein the first command is an all-bank refresh command.

7. The semiconductor memory device of claim 5, wherein the first command is a self-refresh entry command.

8. The semiconductor memory device of claim 1, wherein the control logic circuit is configured to provide the memory controller with the error information of the some faulty memory cell rows in the error log register as an error information signal, in response to a register read command from the memory controller.

9. A memory system comprising:
a semiconductor memory device; and
a memory controller configured to control the semiconductor memory device, wherein the semiconductor memory device includes:
a memory cell array including a plurality of memory bank arrays, wherein each memory bank array includes a plurality of memory cell rows, wherein each of the memory cell rows includes a plurality of sub-pages to store a plurality of codewords, each codeword including a main data and a parity data associated with the main data;
an error correction circuit;
an error log register; and
a control logic circuit configured to control the error correction circuit to perform an error correction code (ECC) decoding sequentially on the sub-pages for detecting at least one bit error in each of the memory cell rows in response to a first command from the memory controller in an error check and scrub (ECS) mode, wherein the control logic circuit is configured to perform an error logging operation to write error information into the error log register, and wherein the error information includes a number of faulty codewords in each of some faulty memory cell rows, which is determined by the control logic circuit, wherein the at least one bit error is detected in each of the at faulty codewords, wherein the semiconductor memory device is configured to notify the memory controller that the number of error occurrences in one memory cell row of the some faulty memory cell rows has reached a threshold immediately by using an alert signal, and wherein the memory controller is configured to apply a scrubbing command to the semiconductor memory device, in response to the alert signal.

10. The memory system of claim 9, wherein the error correction circuit is configured to perform a scrubbing operation consecutively on sub-pages of the one memory cell row in response to the scrubbing command.

11. The memory system of claim 9, wherein the first command is an ECS entry command designating the ECS mode or a refresh command.

12. The memory system of claim 11, wherein the refresh command is periodic all-bank refresh commands.

13. The memory system of claim 11, wherein the refresh command is periodic self-refresh commands.

14. A method of operating a memory system including a semiconductor memory device and a memory controller configured to control the semiconductor memory device, wherein the semiconductor memory device includes a memory cell array including a plurality of memory bank arrays, each memory bank array includes a plurality of memory cell rows, each of the memory cell rows includes a plurality of sub-pages to store a plurality of codewords, and each codeword includes a main data and a parity data associated with the main data, the method comprising:

generating, by the memory controller, a first command and an access address;

performing, by an error correction circuit in the semiconductor memory device, an error correction code (ECC) decoding sequentially on the sub-pages for detecting at least one bit error in each of the sub-pages, in response to the first command in an ECS mode;

performing, by a control logic circuit in the semiconductor memory device, an error logging operation to write error information into an error log register, the error information including a number of faulty codewords in each of some faulty memory cell rows;

transmitting, by the semiconductor memory device, the page error information as an error information signal to the memory controller;

notifying, by the semiconductor memory device, the memory controller that the number of error occurrences in one memory cell row of the some faulty memory cell rows has reached a threshold immediately by using an alert signal; and applying, by the memory controller, a scrubbing command to the semiconductor memory device, in response to the alert signal.

15. The method of claim 14, further comprising:
performing, by the error correction circuit, a scrubbing operation consecutively on sub-pages of the one memory cell row in response to the scrubbing command.

16. The method of claim 14, further comprising:
determining, by the control circuit in the semiconductor memory device, the number of the faulty codewords of each of the some faulty memory cell rows among the plurality of memory cell rows, based on a result of the ECC decoding, the at least one bit error being detected in each of the faulty codewords before performing the error logging operation.

17. The method of claim 14, further comprising:
generating, by the memory controller, a second command; and
selectively exiting, by the semiconductor memory device, the ECS mode in response to the second command.

18. The method of claim 14, wherein the first command is an ECS entry command designating the ECS mode or a refresh command.

19. The method of claim 18, wherein the refresh command is periodic all-bank refresh commands.

20. The method of claim 18, wherein the refresh command is periodic self-refresh commands.

* * * * *